US011276842B2

(12) United States Patent
Kitahara

(10) Patent No.: US 11,276,842 B2
(45) Date of Patent: Mar. 15, 2022

(54) LIGHT-EMITTING DEVICE

(71) Applicant: PIONEER CORPORATION, Tokyo (JP)

(72) Inventor: Hiroaki Kitahara, Tokyo (JP)

(73) Assignee: PIONEER CORPORATION, Tokyo (JP)

(*) Notice: Subject to any disclaimer, the term of this patent is extended or adjusted under 35 U.S.C. 154(b) by 113 days.

(21) Appl. No.: 16/315,577

(22) PCT Filed: Jul. 3, 2017

(86) PCT No.: PCT/JP2017/024336
§ 371 (c)(1),
(2) Date: Jan. 4, 2019

(87) PCT Pub. No.: WO2018/012335
PCT Pub. Date: Jan. 18, 2018

(65) Prior Publication Data
US 2019/0305253 A1 Oct. 3, 2019

(30) Foreign Application Priority Data
Jul. 12, 2016 (JP) .............................. JP2016-137992

(51) Int. Cl.
H01L 51/52 (2006.01)
H01L 27/32 (2006.01)
(Continued)

(52) U.S. Cl.
CPC ............ H01L 51/5271 (2013.01); F21S 2/00 (2013.01); G02B 5/08 (2013.01); H01L 27/322 (2013.01);
(Continued)

(58) Field of Classification Search
CPC ... H01L 51/5271; H01L 51/50; H01L 27/322; H05B 33/24
See application file for complete search history.

(56) References Cited

U.S. PATENT DOCUMENTS 7,102,282 B1   9/2006  Yamada et al.
7,218,049 B2   5/2007  Yamada et al.
(Continued)

FOREIGN PATENT DOCUMENTS

JP    H09-190883 A    7/1997
JP    2000-284726 A   10/2000
(Continued)

OTHER PUBLICATIONS

International Search Report for related International Application No. PCT/JP2017/024336, dated Sep. 26, 2017; 2 pages.

Primary Examiner — Tuan A Hoang
(74) Attorney, Agent, or Firm — Procopio, Cory, Hargreaves & Savich LLP

(57) ABSTRACT

A light distribution of light from a light-emitting device (10) has a higher luminous intensity in a first direction (D1) compared to a reference direction (R), the first direction (D1) being different from the reference direction (R). The reference direction (R) is a center direction of the light distribution, for example, a direction along the thickness direction of a substrate (100), a direction along the width direction of each layer (for example, an EML (126)) of a resonator (150), or a normal direction of a second surface (104) of the substrate (100). In addition, the light distribution has a higher luminous intensity in a second direction (D2) compared to the reference direction (R), the second direction (D2) being on an opposite side of the first direction (D1) with respect to the reference direction (R).

16 Claims, 35 Drawing Sheets

US 11,276,842 B2
Page 2

(51) Int. Cl.
   *G02B 5/08*    (2006.01)
   *H01L 51/50*   (2006.01)
   *F21S 2/00*    (2016.01)
   *H05B 33/24*   (2006.01)
   *F21Y 115/15*  (2016.01)
   *F21W 103/35*  (2018.01)
   *F21S 43/145*  (2018.01)

(52) U.S. Cl.
   CPC .............. *H01L 51/50* (2013.01); *H05B 33/24* (2013.01); *F21S 43/145* (2018.01); *F21W 2103/35* (2018.01); *F21Y 2115/15* (2016.08)

(56) References Cited

U.S. PATENT DOCUMENTS

| | | | |
|---|---|---|---|
| 7,710,025 B2 | 5/2010 | Yamada et al. | |
| 8,602,600 B2 | 12/2013 | Kubota | |
| 8,766,533 B2 | 7/2014 | Kobayashi | |
| 9,721,998 B2 | 8/2017 | Yamazaki | |
| 2006/0175966 A1* | 8/2006 | Yamada | H01L 51/5265 313/506 |
| 2007/0228943 A1 | 10/2007 | Yamada et al. | |
| 2011/0148944 A1* | 6/2011 | Kobayashi | H01L 27/3267 345/690 |
| 2012/0081892 A1 | 4/2012 | Kubota | |
| 2013/0113843 A1 | 5/2013 | Yamazaki | |
| 2014/0252336 A1 | 9/2014 | Kobayashi | |
| 2016/0021718 A1* | 1/2016 | Kikuchi | H01L 27/3216 362/231 |
| 2017/0271415 A1 | 9/2017 | Yamazaki | |

FOREIGN PATENT DOCUMENTS

| | | |
|---|---|---|
| JP | 2006-147598 A | 6/2006 |
| JP | 2008-071560 A | 3/2008 |
| JP | 2010-217581 A | 9/2010 |
| JP | 2011-129392 A | 6/2011 |
| JP | 2012-079575 A | 4/2012 |
| JP | 2013-117719 A | 6/2013 |
| JP | 2014-157796 A | 8/2014 |

* cited by examiner

10

| LAYER | THICKNESS [nm] | REFRACTIVE INDEX |
|---|---|---|
| SUBSTRATE | — | 1.52 |
| SEMI-TRANSPARENT REFLECTION LAYER | 30 | — |
| FIRST LAYER (FIRST ELECTRODE) | 135 | 1.91 |
| SECOND LAYER (HIL) | * | 1.68 |
| THIRD LAYER (HTL) | 20 | 1.82 |
| FOURTH LAYER (EML) | 30 | 1.94 |
| FIFTH LAYER (ETL) | * | 1.83 |
| REFLECTION LAYER (SECOND ELECTRODE) | 200 | — |

WAVELENGTH $\lambda$ : 630nm

FIG. 6

| $\theta_0$[deg] | 0.0 | 10.0 | 20.0 | 30.0 | 40.0 | 50.0 | 60.0 | 70.0 |
|---|---|---|---|---|---|---|---|---|
| | | | | | | | WAVELENGTH $\lambda$ :630nm | |
| $\theta_s$[deg] | 0.0 | 6.6 | 13.0 | 19.2 | 25.0 | 30.3 | 34.7 | 38.2 |
| $\theta_1$[deg] | 0.0 | 5.2 | 10.3 | 15.2 | 19.7 | 23.6 | 27.0 | 29.5 |
| $\theta_2$[deg] | 0.0 | 5.9 | 11.7 | 17.3 | 22.5 | 27.1 | 31.0 | 34.0 |
| $\theta_3$[deg] | 0.0 | 5.5 | 10.8 | 15.9 | 20.7 | 24.9 | 28.4 | 31.1 |
| $\theta_4$[deg] | 0.0 | 5.1 | 10.2 | 14.9 | 19.3 | 23.3 | 26.5 | 29.0 |
| $\theta_5$[deg] | 0.0 | 5.4 | 10.8 | 15.9 | 20.6 | 24.7 | 28.2 | 30.9 |

FIG. 7

| $\theta_0$[deg] | 0 | 10 | 20 | 30 | 40 | 50 | 60 | 70 | WAVELENGTH $\lambda$:630nm |
|---|---|---|---|---|---|---|---|---|---|
| $\Delta L$[nm] | — | 2.4 | 9.2 | 19.8 | 33.2 | 47.9 | 62.1 | 74.0 | |
| $\Delta D$[nm] | — | 1.4 | 5.5 | 12.1 | 20.8 | 31.1 | 41.8 | 51.4 | |
| $\Delta d_2$[nm] | — | 1.0 | 4.0 | 8.9 | 15.4 | 23.0 | 31.0 | 38.1 | |
| $\Delta d_5$[nm] | — | 0.4 | 1.4 | 3.1 | 5.4 | 8.1 | 10.8 | 13.3 | |
| $d_2$[nm] | 58.6 | 59.6 | 62.6 | 67.5 | 74.0 | 81.6 | 89.6 | 96.7 | |
| $d_5$[nm] | 43.3 | 43.7 | 44.7 | 46.4 | 48.7 | 51.4 | 54.1 | 56.6 | |

LIGHT-EMITTING DEVICE

CROSS-REFERENCE TO RELATED APPLICATIONS

This application is a U.S. National Stage entry of PCT Application No: PCT/JP2017/024336 filed Jul. 3, 2017, the contents of which are incorporated herein by reference.

TECHNICAL FIELD

The present invention relates to a light-emitting device.

BACKGROUND ART

In recent years, organic light-emitting diodes (OLEDs) having a microcavity structure have been developed. Such OLEDs include a reflecting layer, a semi-transparent reflecting layer, and an organic layer. The organic layer is between the reflecting layer and the semi-transparent reflecting layer and emits light. The light from the organic layer is reflected between the reflecting layer and the semi-transparent reflecting layer and emitted from the semi-transparent reflecting layer side.

Patent Document 1 describes an example of OLEDs having a microcavity structure. The OLED described in Patent Document 1 is formed so that a distance L between the reflecting layer and the semi-transparent reflecting layer satisfies $2L/\lambda + \varphi/(2\pi) = m$ (m is an integer) ($\lambda$: a wavelength of light from the organic layer, $\varphi$: a phase shift amount generated in the reflecting layer and the semi-transparent reflecting layer, m: an integer).

Patent Document 2 describes an example of OLEDs having a microcavity structure. The OLED described in Patent Document 2 includes a scattering member which scatters light emitted by the microcavity structure. In Patent Document 2, the light scattered by the scattering member is emitted from the OLED.

Patent Document 3 describes an example of OLEDs having a microcavity structure. The OLED described in Patent Document 3 includes a substrate having a concave portion. The microcavity structure is formed in the concave portion of the substrate. Patent Document 3 describes that an emitting range of light emitted from the OLED becomes wider due to the concave portion.

RELATED ART DOCUMENT

Patent Documents

[Patent Document 1]: Japanese Unexamined Patent Application Publication No. 2006-147598
[Patent Document 2]: Japanese Unexamined Patent Application Publication No. 2000-284726
[Patent Document 3]: Japanese Unexamined Patent Application Publication No. H09-190883

SUMMARY OF THE INVENTION

Generally, a light distribution of an OLED having a microcavity structure has a maximum value in: a center direction of the light distribution (for example, a direction along the thickness of the microcavity structure (particularly, a direction along the thickness of a semi-transparent reflecting layer on the light extraction side); a direction along the thickness direction of an organic layer between a reflecting layer and the semi-transparent reflecting layer; or a direction along the thickness of a surface of a substrate of the OLED having a microcavity structure or a direction perpendicular to the substrate surface, or a normal direction thereof). The inventor of the present invention investigated a method for obtaining a maximum value of a light distribution of an OLED having a microcavity structure in a direction different from a center direction of the light distribution.

An example of the problem to be solved by the present invention is to obtain a maximum value of a light distribution of an OLED having a microcavity structure in a direction which is different from a center direction of the light distribution.

Means for Solving the Problem

The invention described in claim 1 is a light-emitting device including:
a light-emitting unit including:
a reflecting layer,
a semi-transparent reflecting layer, and
an organic layer between the reflecting layer and the semi-transparent layer, the organic layer including a light-emitting layer,
in which a light distribution of light from the light-emitting unit has a higher luminous intensity in a first direction compared to a reference direction, the reference direction being along a thickness direction of the light-emitting layer and the first direction being different from the reference direction.

The invention described in claim 7 is a light-emitting device including:
a plurality of light-emitting units, each light-emitting unit including:
a reflecting layer,
a semi-transparent reflecting layer, and
an organic layer between the reflecting layer and the semi-transparent reflecting layer, the organic layer including a light-emitting layer,
in which a light distribution of light from at least one light-emitting unit out of the plurality of light-emitting units has a higher luminous intensity in a first direction compared to a reference direction, the reference direction being along a thickness direction of the light-emitting layer and the first direction being different from the reference direction, and
in which the plurality of light-emitting units emit light of different emission colors.

BRIEF DESCRIPTION OF THE DRAWINGS

The objects described above, and other objects, features and advantages are further made apparent by suitable embodiments that will be described below and the following accompanying diagrams.

FIG. 6 is a table showing a refractive angle in each layer of the light-emitting device illustrated in FIG. 5.

FIG. 7 is a table to explain an example of a method of designing the light-emitting device shown in FIG. 5 using the method shown in FIG. 4.

DESCRIPTION OF EMBODIMENT

Figure 1:
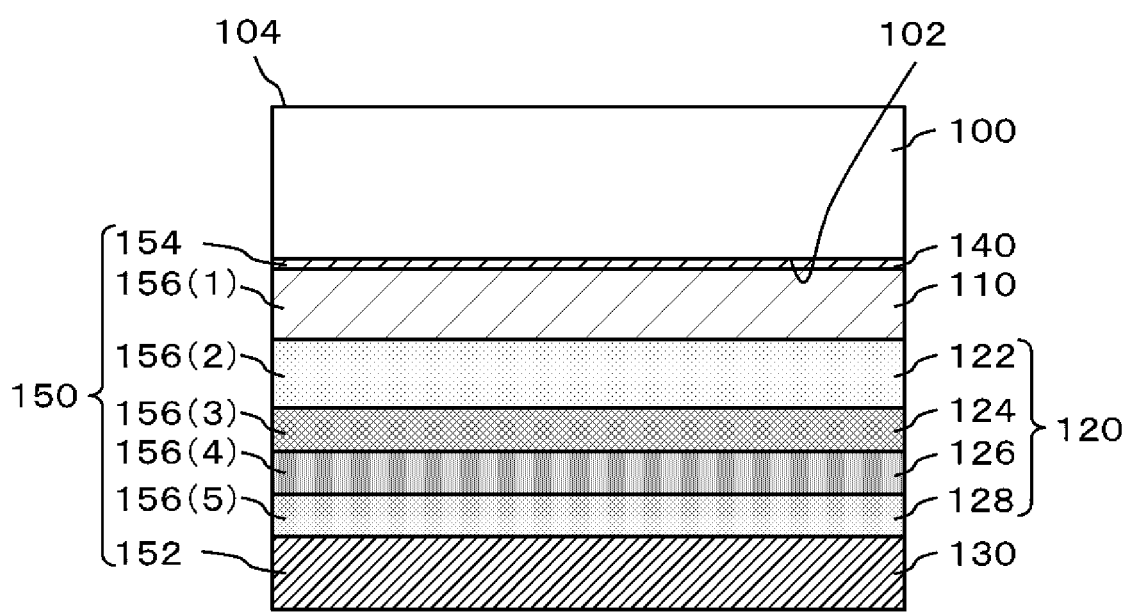
FIG. 1 is a diagram of a light-emitting device according to an embodiment.

An embodiment of the present invention will be described below by referring to the drawings. Moreover, in all the drawings, the same constituent elements are given the same reference numerals, and descriptions thereof will not be repeated. Further, in a range of the present specification, drawings, and patent claims, "above", "below", or "between" is a description regarding a positional relationship, and whether directly being in contact or not is not limited unless otherwise indicated.

Figure 2:
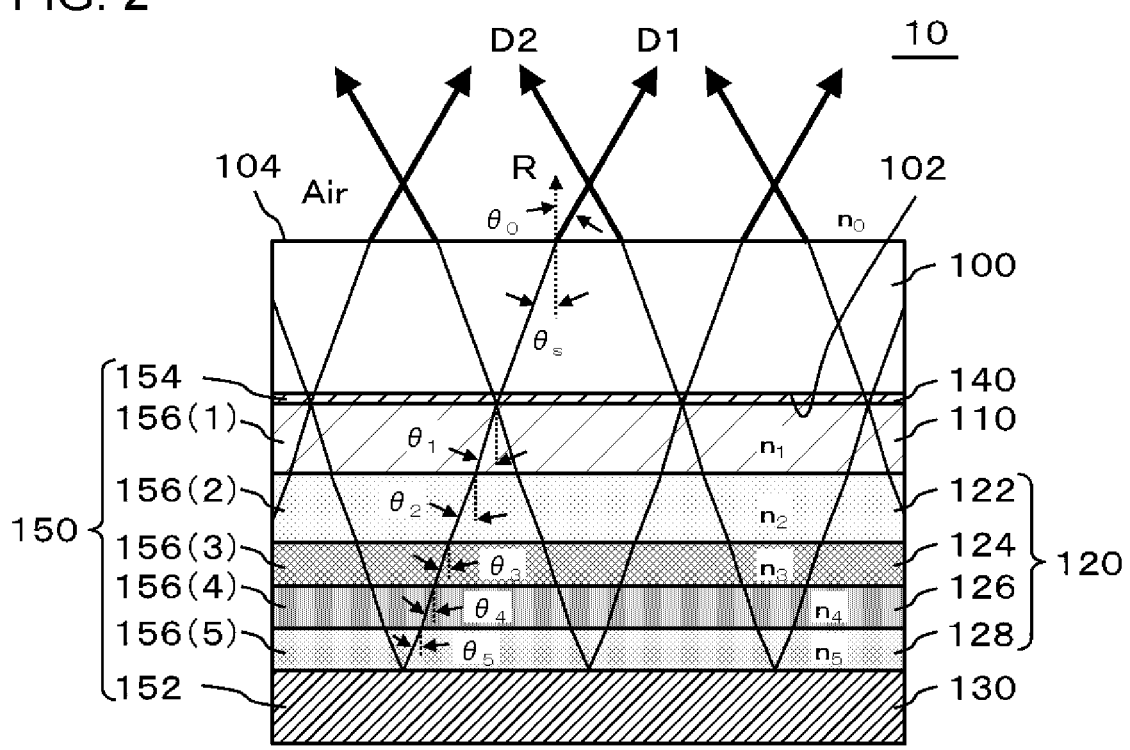
FIG. 2 is a diagram to explain a movement of the light-emitting device illustrated in FIG. 1.

FIG. 1 is a diagram showing a light-emitting device 10 according to the embodiment. FIG. 2 is a drawing explaining the operation of the light-emitting device 10 shown in FIG. 1. The light-emitting device 10 includes a reflecting layer 152, a semi-transparent reflecting layer 154, and an organic layer 120. The organic layer 120 is between the reflecting layer 152 and the semi-transparent reflecting layer 154. The organic layer 120 includes a light-emitting layer (EML) 126. A light distribution of light from the light-emitting device 10 has a higher luminous intensity in a first direction D1 that is different from a reference direction R compared to the luminous intensity in the reference direction R. The reference direction R is a central direction of the light distribution of the light-emitting device 10 (or a later described light-transmitting region 242 or a light-emitting unit 172), and in an example shown in FIG. 2, for example, is a direction along the thickness direction of a substrate 100, a direction along the thickness direction of each layer (for example, the EML 126) of a resonator 150, or a normal direction of a second surface 104 of the substrate 100. In addition, the light distribution has a higher luminous intensity also in a second direction D2 which is on an opposite side of the first direction D1 with respect to the reference direction R compared to the luminous intensity in the reference direction R. In the example shown in FIG. 2, the first direction D1 and the second direction D2 are symmetric with respect to the reference direction R. Particularly in the example shown in FIG. 2, the light distribution has a maximum value in each of the first direction D1 and the second direction D2.

More specifically, the light-emitting device 10 includes k layers of layers 156 (k is an integer which is equal to or greater than 2) which are from a first layer 156 (1) to the k-th layer 156 (k). In the examples shown in FIG. 1 and FIG. 2, k is 5. These layers 156 are between the reflecting layer 152 and the semi-transparent reflecting layer 154. In the light-emitting device 10, a value ΔM which is defined by Formula (1) below is equal to or greater than m−⅛ and equal to or less than m+⅛ (m is an integer which is equal to or greater than 1). A detailed description will be provided below.

[Formula 1]

$$\Delta M = \frac{2}{\lambda} \sum_{i=1}^{k} d_i \sqrt{n_i^2 - n_0^2 \sin^2 \theta_0} + \frac{1}{2\pi}(\phi_S + \phi_R) \quad (1)$$

λ: Peak wavelength of light from EML 126
$d_i$: Thickness of i-th layer 156 (i) (1≤i≤k)
$n_i$: Refractive index of i-th layer 156 (i) (1≤i≤k)
$n_0$: Refractive index of medium propagated by light from light-emitting device 10 (or second surface 102 of substrate 100)
$\theta_0$: Angle of direction at which above-mentioned light distribution has maximum value
$\phi_S$: Phase shift amount of semi-transparent reflecting layer 154
$\phi_R$: Phase shift amount of reflecting layer 152.

The light-emitting device 10 includes a substrate 100, a first electrode 110, an organic layer 120, a second electrode 130, and a layer 140. The substrate 100 includes a first surface 102 and a second surface 104. The second surface 104 is on the opposite side of the first surface 102. The first electrode 110 is above the first surface 102 of the substrate 100. The second electrode 130 is above the first electrode 110. The organic layer 120 is between the first electrode 110 and the second electrode 130. The organic layer 120 includes a hole injection layer (HIL) 122, a hole transporting layer (HTL) 124, a light-emitting layer (EML) 126, and an electron transporting layer (ETL) 128.

The light-emitting device 10 includes the resonator 150. The resonator 150 includes a reflecting layer 152, a semi-transparent reflecting layer 154, and a first layer 156 (1) to a fifth layer 156 (5). The resonator 150 is configured of a first electrode 110, an organic layer 120, a second electrode 130, and a layer 140. Specifically, the second electrode 130 functions as the reflecting layer 152. The layer 140 functions as the semi-transparent reflecting layer 154. The first electrode 110 functions as the first layer 156 (1). The HIL 122, the HTL 124, the EML 126, and the ETL 128 function as a second layer 156 (2), a third layer 156 (3), a fourth layer 156 (4), and a fifth layer 156 (5), respectively.

The substrate 100 has light-transmitting properties, and specifically, for example, is a glass substrate or a resin substrate. The substrate 100 may or may not have flexibility. The thickness of the substrate 100 is, for example, equal to or greater than 10 μm and equal to or less than 1 mm.

The first electrode 110 has light-transmitting properties, and formed of, for example, a metal oxide, more specifically, for example, an indium tin oxide (ITO), an indium zinc oxide (IZO), an indium tungsten zinc oxide (IWZO), or a zinc oxide (ZnO).

The organic layer 120 includes an HIL 122, an HTL 124, an EML 126, and an ETL 128. However, the layer structure of the organic layer 120 is not limited to this example. As an example, the organic layer 120 may include an electron injection layer (EIL) between the second electrode 130 and the ETL 128. In this example, the EIL functions as a sixth layer 156 (6). As another example, the organic layer 120 need not include a HIL 122 or a HTL 124. Further, as still another example, the organic layer 120 may include a hole blocking layer (HBL), an electron blocking layer (EBL), a buffer layer, a spacer layer, a light extraction improvement layer, an adhesive layer, or a color filter layer. In addition, the organic layer 120 may have a multi-unit structure having a plurality of light-emitting layers, and in this example, for example, two or more sets of the HIL 122, the HTL 124, the EML 126, and the ETL 128 may be included.

The second electrode 130 functions as the reflecting layer 152. The second electrode 130 is formed of a material that reflects light, such as a metal, for example, Al, Ag, an Al alloy, or an Ag alloy. The thickness of the second electrode 130 is thick to a certain degree, for example, equal to or greater than 70 nm and equal to or less than 200 nm. Thus, the second electrode 130 functions as the reflecting layer 152.

The layer 140 functions as the semi-transparent reflecting layer 154. In an example, the layer 140 is a metal thin film, and specifically, for example, an Ag thin film, an Au thin film, an Ag alloy thin film, or an Au alloy thin film. In this example, the thickness of the layer 140 is thin to a certain degree, and specifically, for example, thinner than the thickness of the second electrode 130, and more specifically, for example, equal to or greater than 5 nm and equal to or less than 50 nm. In a case where the film thickness of the layer 140 is thin as such, a portion of light incident on the layer 140 can be transmitted through the layer 140. Thereby, the layer 140 functions as the semi-transparent reflecting layer 154. In another example, the layer 140 may be a dielectric multilayer film including a high refractive index dielectric layer and a low refractive index dielectric layer laminated alternately. In this example also, the layer 140 can function as the semi-transparent reflecting layer 154.

Figure 3:
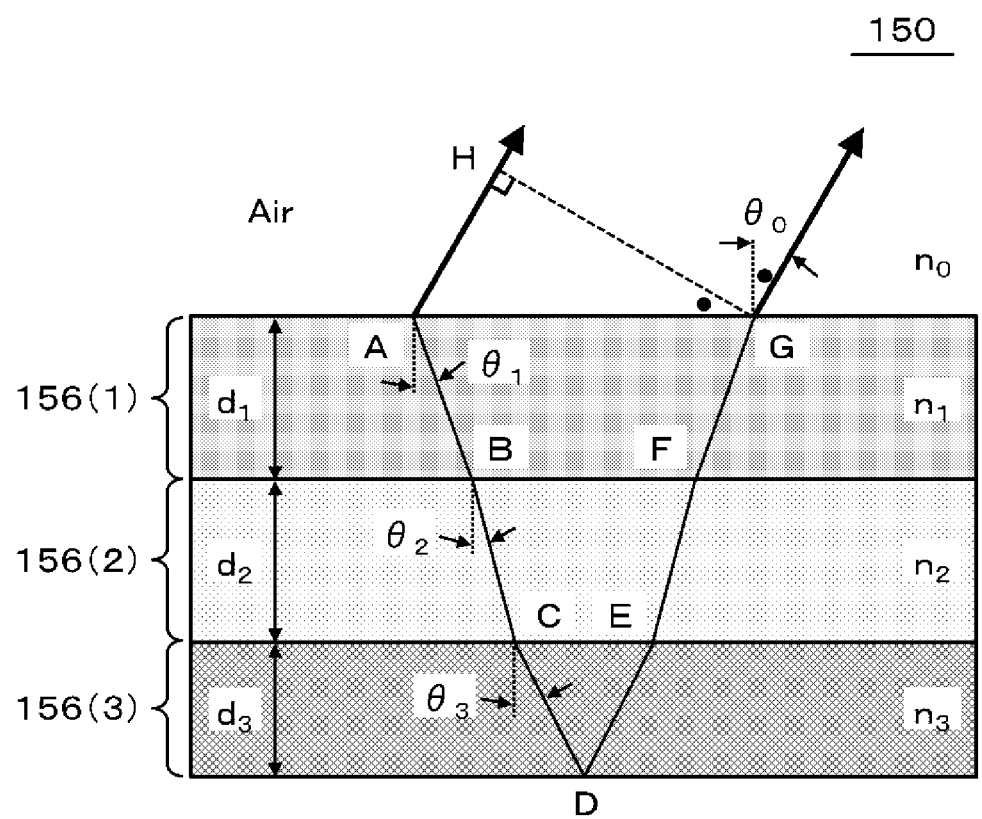
FIG. 3 is a diagram to explain the derivation of Formula (1).

FIG. 3 is a drawing to explain the derivation of Formula (1). In the drawing, k=3, and the resonator 150 includes a first layer 156 (1), a second layer 156 (2), and a third layer 156 (3). Meanwhile, in the present drawing, the reflecting layer 152 (FIG. 1 and FIG. 2) and the semi-transparent reflecting layer 154 (FIG. 1 and FIG. 2) are removed for ease of explanation.

In the example shown in the drawing, a mutually strengthening interference is generated by light emitted at a refractive angle $\theta_0$ from the first layer 156 (1) to the medium having a refractive index $n_0$ (specifically, air). Thereby, the light distribution of light has a maximum value in the angle $\theta_0$ direction.

Specifically, an optical path difference $\Delta l_3$ defined by the following Formula (2) is an integral multiple of a wavelength λ of the above-mentioned light.

[Formula 2]

$$\Delta l_3 = \sum_{i=1}^{3} \frac{2n_i d_i}{\cos\theta_i} - n_0 \sin\theta_0 \sum_{i=1}^{3} 2d_i \tan\theta_i \quad (2)$$

The first term on the right side of Formula (2) is the sum of an optical path length between A and B, an optical path length between B and C, an optical path length between C and D, an optical path length between D and E, an optical path length between E and F, and an optical path length between F and G. The second term on the right side of Formula (2) is an optical path length between A and H. The optical path length between A and H is derived using AG=$2d_1 \tan\theta_1 + 2d_2 \tan\theta_2 + 2d_3 \tan\theta_3$, $\angle AGH=\theta_0$, and AH=AG $\sin\theta_0$.

The first term on the right side of Formula (1) is derived by generalizing the right side of Formula (2) by applying the number of layers k of the layer 156 to the right side of Formula (2) and using Snell's law $n_0 \sin\theta_0 = n_i \sin\theta_i$. In addition, a second term on the right side of Formula (2) is derived by taking the phase shift amount of the reflecting layer 152 and the phase shift amount of the semi-transparent reflecting layer 154 into consideration.

In a case where the value ΔM is an integer in Formula (1), the mutually strengthening interference is generated by light emitted at the refractive angle $\theta_0$. Thereby, the light distribution of light has a maximum value in the angle $\theta_0$ direction. However, the value ΔM need not strictly match a specific integer. The value ΔM may be deviated from an integer m (m≥1) by, for example, ±⅛, and preferably, for example, ±1/16.

Meanwhile, in an example, phase shift amounts $\varphi_S$ and $\varphi_R$ may be determined based on $\tan\varphi_S = 2n_1 k_S/(n_1^2 - n_S^2 - k_S^2)$, and $\tan\varphi_R = 2n_k k_R/(n_k^2 - n_R^2 - k_R^2)$, respectively ($n_S$: a refractive index of the semi-transparent reflecting layer 154, $k_S$: an extinction coefficient of the semi-transparent reflecting layer 154, $n_R$: a refractive index of the reflecting layer 152, $k_R$: an extinction coefficient of the reflecting layer 152). In another example, the phase shift amounts $\varphi_S$ and $\varphi_R$ may be determined based on a measurement result using spectral ellipsometry.

Figures 4, 5:
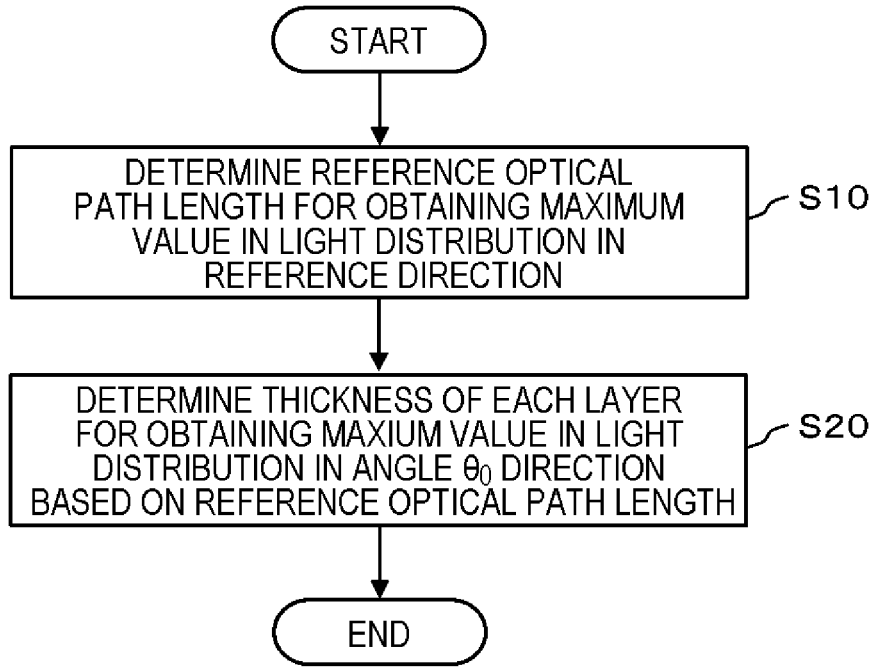
FIG. 4 is a flowchart to explain an example of a method of designing the light-emitting device illustrated in FIG. 1 and FIG. 2.
FIG. 5 is a table showing an example of the light-emitting device illustrated in FIG. 1 and FIG. 2.

FIG. 4 is a flowchart explaining an example of a method of designing the light-emitting device 10 shown in FIG. 1 and FIG. 2. First, a reference optical path length is determined so that the light distribution has a maximum value in the reference direction R ($\theta_0$=0) (S10). The reference optical path length is an optical path length between the reflecting layer 152 and the semi-transparent reflecting layer 154, and is $d'_1 n_1 + d'_2 n_2 + \ldots + d'_k n_k$ ($d'_i$: the thickness of the i-th layer 156 (i)).

Next, the thicknesses $d_1$-$d_k$ of each of layers 156 are determined based on the reference optical path length so that the light distribution has a maximum value in the angle $\theta_0$ direction (S20). Specifically, the thicknesses $d_1$-$d_k$ of each of the layers 156 are determined to satisfy Formula (3) below.

[Formula 3]

$$\sum_{i=1}^{k} d_i \sqrt{n_i^2 - n_0^2 \sin^2\theta_0} = \sum_{i=1}^{k} d'_i n_i \quad (3)$$

Formula (3) is derived as follows. First, the value ΔM in a case where the light distribution has a maximum value in the reference direction R ($\theta_0$=0) is the following Formula (4) based on Formula (1).

[Formula 4]

$$\Delta M'(0) = \frac{2}{\lambda} \sum_{i=1}^{k} d'_i n_i + \frac{1}{2\pi}(\phi_S + \phi_R) \quad (4)$$

Next, the value ΔM in a case where the light distribution in the angle $\theta_0$ direction has a maximum value is the following Formula (5) based on Formula (1).

[Formula 5]

$$\Delta M(\theta_0) = \frac{2}{\lambda} \sum_{i=1}^{k} d_i \sqrt{n_i^2 - n_0^2 \sin^2\theta_0} + \frac{1}{2\pi}(\phi_S + \phi_R) \quad (5)$$

Formula (3) is derived by ΔM ($\theta_0$=0)=ΔM' (0) using Formula (4) and Formula (5).

Meanwhile, when deriving Formula (3), the phase shift amounts $\varphi_S$ and $\varphi_R$ at ΔM ($\theta_0$) are assumed to be equal to the phase shift amounts $\varphi_S$ and $\varphi_R$ at ΔM' (0), respectively. Thereby, when deriving Formula (3), the phase shift amounts $\varphi_S$ and $\varphi_R$ are dropped out. In other words, when determining the thicknesses $d_1$-$d_k$ of each of the layers 156 using Formula (3), the phase shift amounts $\varphi_S$ and $\varphi_R$ need not be calculated.

In S20, the thicknesses $d_1$-$d_k$ are determined by adjusting the thicknesses $d'_1$-$d'_k$ determined in S10. In an example, to satisfy Formula (3), the thickness of a layer of the organic layer 120 that is the closest to the semi-transparent reflecting layer 154 (in the examples shown in FIG. 1 and FIG. 2, the second layer 156 (2)), and the thickness of a layer of the organic layer 120 that is the closest to the reflecting layer 152 (in the examples shown in FIG. 1 and FIG. 2, the fifth layer 156 (5)) may be adjusted. However, the thickness of a layer 156 other than the layers 156 described in this example may be adjusted.

Further, in S20, the thicknesses $d_1$-$d_k$ may be determined so that the ratio between the optical path length from the center of the EML 126 to the reflecting layer 152 and the optical path length from the center of the EML 126 to the semi-transparent reflecting layer 154 is the same when the thicknesses are $d'_1$-$d'_k$ and when the thicknesses are $d_1$-$d_k$. By determining the thicknesses in this way, the carrier balance in the organic layer 120 may be inhibited from being changed between an element when $\theta_0$=0 and an element when having a peak at the angle $\theta_0$. Meanwhile, the number of layers adjusted in thickness may be increased in a multi-unit structure in which the organic layer 120 has a plurality of light-emitting layers EML. For example, in an example of a structure having two light-emitting layers in an organic layer 120 which is the so-called tandem unit structure, the thickness of any of the layers interposed between a first light-emitting layer and a second light-emitting layer may be adjusted in addition to the two layers explained in the above-mentioned example. In a structure having three light-emitting layers in an organic layer 120 which is the so-called tridem unit structure, the film thickness is preferably adjusted in two layers between the light-emitting layers in addition to the aforementioned two layers. Thus, in the multi-unit structure, layers in a number which is the sum of the number of the light-emitting layers plus one are preferably adjusted.

FIG. 5 is a table showing an example of the light-emitting device 10 illustrated in FIG. 1 and FIG. 2. FIG. 6 is a table showing a refractive angle in each layer of the light-emitting device 10 illustrated in FIG. 5. FIG. 7 is a table explaining an example of a method of designing the light-emitting device 10 shown in FIG. 5 using a method shown in FIG. 4. In the example shown in FIG. 7, the light-emitting device 10 is designed so that the light distribution has a maximum value at a design angle of 0 degrees to 70 degrees.

In the example shown in FIG. 5, the light-emitting device 10 includes a substrate 100, a semi-transparent reflecting layer 154 (layer 140), a first layer 156 (1) (a first electrode 110), a second layer 156 (2) (HIL 122), a third layer 156 (3) (HTL 124), a fourth layer (4) (EML 126), a fifth layer 156 (5) (ETL 128), and a reflecting layer 152 (second electrode 130).

FIG. 6 shows a refractive angle $\theta_S$ at the substrate 100, a refractive angle $\theta_1$ at the first layer 156 (1), a refractive angle $\theta_2$ on the second layer 156 (2), a refractive angle $\theta_3$ on the third layer 156 (3), a refractive angle $\theta_4$ on the fourth layer 156 (4), and a refractive angle $\theta_5$ at the fifth layer 156 (5) in a case where light of a wavelength $\lambda$ 630 nm is emitted at each refractive angle $\theta_0$ at 0.0 to 70.0 degrees from the second surface 104 of the substrate 100. The refractive angles $\theta_S$ and $\theta_1$-$\theta_5$ may be calculated from $n_0 \sin \theta_0 = n_i \sin \theta_i$ based on Snell's law.

As shown in FIG. 7, the thickness $d_2$ of the second layer 156 (2) and the thickness $d_5$ of the fifth layer 156 (5) may be determined. Specifically, first, the reference optical path length is determined using an optical simulation so that the light distribution has a maximum value in the reference direction ($\theta_0=0$) (S10 in FIG. 4). In other words, the thicknesses $d'_1$-$d'_5$ of each of layers 156 are determined so that the light distribution has a maximum value in the reference direction ($\theta_0=0$). In the example shown in FIG. 7, the reference optical path length is 530 nm. Next, the thicknesses of each of layers 156 $d_1$-$d_5$ are determined to satisfy Formula (3) (S20 in FIG. 4).

In detail, after calculating the reference optical path lengths (that is, the thicknesses $d'_1$-$d'_5$), an optical path length $\Delta L$ satisfying the following Formula (6) is calculated.

[Formula 6]

$$\sum_{i=1}^{k} d'_i \sqrt{n_i^2 - n_0^2 \sin^2 \theta_0} + \Delta L = \sum_{i=1}^{k} d'_i n_i \quad (6)$$

Formula (6) is derived by substituting $d_i = d'_i + \Delta d_i$ in the left side of Formula (3). Thereby, the optical path length $\Delta L$ is as per Formula (7) below.

[Formula 7]

$$\Delta L = \sum_{i=1}^{k} \Delta d_i \sqrt{n_i^2 - n_0^2 \sin^2 \theta_0} \quad (7)$$

By using Formula (6) and Formula (7), the thickness $\Delta D = \Delta d_1 + \Delta d_2 + \ldots + \Delta d_k$ to be added to the thicknesses $d'_1$-$d'_k$ can be calculated so as to obtain the design angle of $\theta_0$. In the example shown in FIG. 7, the thickness $\Delta d_2$ alone is added to the thickness $d'_2$ of the lowermost layer (the second layer 156 (2)) of the organic layer 120, the thickness $\Delta d_5$ alone is added to the thickness $d'_5$ of the uppermost layer (the fifth layer 156 (5)) of the organic layer 120, and $\Delta d_1 = \Delta d_3 = \Delta d_4 = 0$ is true regarding the other layers 156. As such, the thicknesses $d_1$-$d_5$ of each of the layers 156 are determined.

Meanwhile, in the example shown in FIG. 7, only the second layer 156 (2) (having a function as the HIL) and the fifth layer 156 (5) (having a function as the ETL) which are organic layers are added to $\Delta D$ as adjustment layers. This allows to facilitate adjustment of the film thickness compared to adjustment of the first layer 156 (1) (having a function as the first electrode 110) and to more easily prevent change in the carrier balance generated in a case where the film thickness is adjusted, compared to adjustment of the fourth layer 156 (4) (having a function as the EML). Further, here, the percentages of the film thickness $\Delta D$ added to the second layer 156 (2) and to the fifth layer 156 (5) are set as follows: for the second layer 156 (2), the percentage of thickness to be added is the percentage of the optical distance from a light-emitting position to the semi-transparent reflection film when an optical distance from a semi-transparent reflection film to a reflection electrode is set to 1; and for the fifth layer 156 (5), the percentage of thickness to be added is the percentage of the optical distance from the light-emitting position to the reflection electrode when an optical distance from a semi-transparent reflection film to a reflection electrode is set to 1. Thus, in the example shown in FIG. 7, the thicknesses $d_1$-$d_5$ are determined so that the ratio between the optical path length from the center of the fourth layer 156 (4) to the reflecting layer 152 and the optical path length from the center of the EML 126 to the semi-transparent reflecting layer 154 becomes 0.259:0.741.

Figure 8:
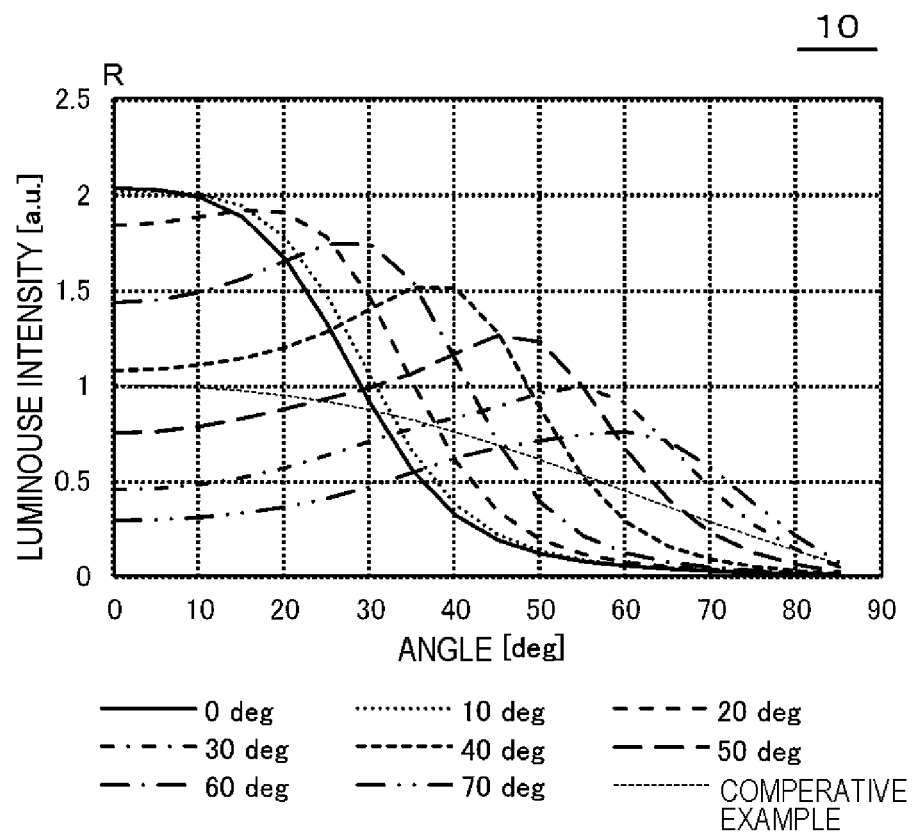
FIG. 8 is a graph showing a light distribution of the light-emitting device designed under the conditions shown in FIG. 7 using rectangular coordinates.

FIG. 8 is a graph showing the light distribution of the light-emitting device 10 designed under the conditions shown in FIG. 7 using rectangular coordinates. In the graph, the luminous intensity of the vertical axis is standardized by the luminous intensity of the light distribution of the light-emitting device 10 in the reference direction R according to a comparative example. The light-emitting device 10 according to the comparative example is the same as the light-emitting device 10 according to the embodiment, except that the semi-transparent reflecting layer 154 is not included, that is, the resonator 150 is not configured.

As shown in the drawing, the light distributions of the light-emitting device 10 at the design angles of 0 degrees, 10 degrees, 20 degrees, 30 degrees, 40 degrees, 50 degrees, 60 degrees, and 70 degrees have maximum values at 0 degrees, 10 degrees, 20 degrees, 30 degrees, 35 degrees, 45 degrees, 55 degrees, and 60 degrees, respectively. Thus, in some design angles, an angle in the direction at which the light distribution has a maximum value corresponds with a design angle, and in other design angles, the angle in the direction at which the light distribution has a maximum value substantially corresponds with a design angle.

It may be said that the light-emitting device 10 is preferably designed so that the light distribution has a maximum value in the direction inclined at, for example, an angle equal to or greater than 5 degrees, preferably, for example, at an angle equal to or greater than 10 degrees from the reference direction R in view of increasing the sharpness of peaks in the light distribution. According to the results shown in the drawing, it may be said a difference between the shape of the light distribution having a maximum value in the reference direction R and the shape of the light distribution having a maximum value in the direction inclined from the reference direction R becomes smaller as the angle at which the light distribution has a maximum value becomes smaller. In contrast, in a case where the light-emitting device 10 is designed so that the light distribution has a maximum value in the direction having an inclination which is, for example, equal to or greater than 5 degrees, and equal to or less than 10 degrees from the reference direction R, the sharpness of the peak of the light distribution is high.

From the viewpoint of positively matching the angle at which the light distribution has a maximum value with the design angle, the light-emitting device 10 is preferably designed so that the light distribution has a maximum value in the direction having an inclination which is equal to or less than 60 degrees, preferably, less than 45 degrees from the reference direction. According to the results shown by the drawing, it may be said that the angle at which the light distribution has a maximum value has a tendency to be smaller than the design angle as the design angle becomes greater. In contrast, in a case where the light-emitting device 10 is designed so that the light distribution has a maximum value in the direction having an inclination which is equal to or less than 60 degrees, preferably, less than 45 degrees from the reference direction R, an angle at which the light distribution has a maximum value positively matches the design angle.

Figure 9A:
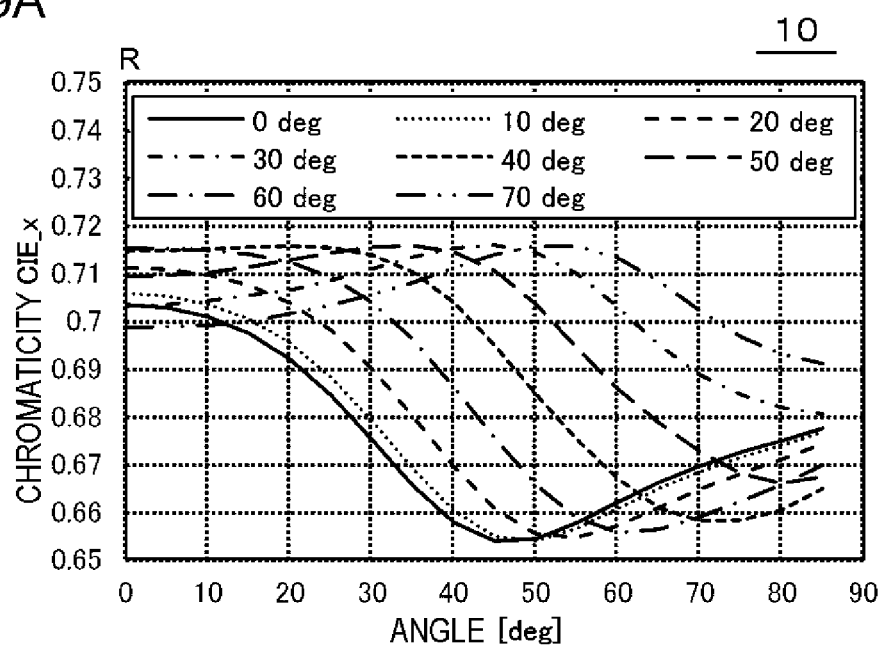
FIG. 9(a) is a graph showing an angular distribution of chromaticity (x) of the light-emitting device designed under the conditions shown in FIG. 7.
Figure 9B:
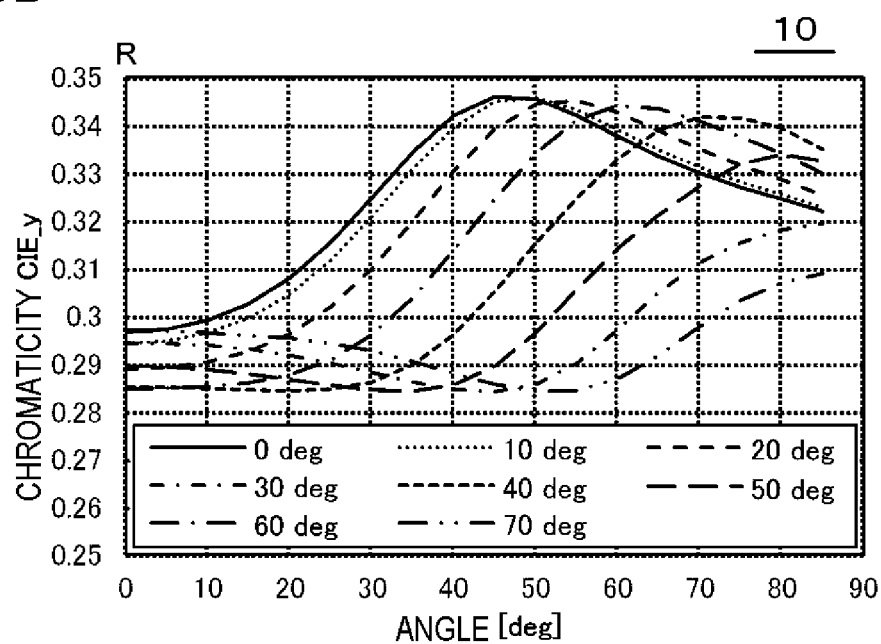
FIG. 9(b) is a graph showing an angular distribution of chromaticity (y) of the light-emitting device designed under the conditions shown in FIG. 7.

FIG. 9(a) and FIG. 9(b) are graphs showing angular distributions of chromaticity of the light-emitting device 10 designed under the conditions shown in FIG. 7. The chromaticity (x, y) of FIG. 9(a) and FIG. 9(b) is the chromaticity of the CIE 1931 color space.

In the example shown in the drawing, the light-emitting device 10 is designed so that the chromaticity (x, y) is (0.700, 0.300) at an angle which is equal to the design angle. Specifically, first, the light-emitting device 10 is designed so that the chromaticity (x, y) thereof at the design angle of 0 degrees is (0.700, 0.300). Next, the light-emitting device 10 at the design angle of 10 degrees-70 degrees is designed using the method shown in FIG. 4. As shown in the drawing of FIG. 9 (a), angular distributions at the design angles of 10 degrees-70 degrees for a value x are similar to the angular distributions which are obtained by moving the angular distributions at the design angle of 0 degrees only by +10 degrees to +70 degrees, respectively. As shown in the drawing of FIG. 9 (b), the angular distributions at the design angles of 10 degrees-70 degrees regarding a value y are similar to the angular distributions which are obtained by moving the angular distribution at the design angle of 0 degrees only by +10 degrees to +70 degrees, respectively. Thereby, the chromaticity (x, y) of the light-emitting device 10 at the design angles of 0 degrees-70 degrees is approximately (0.700, 0.300), respectively, at 0 degrees-70 degrees.

Figure 10:
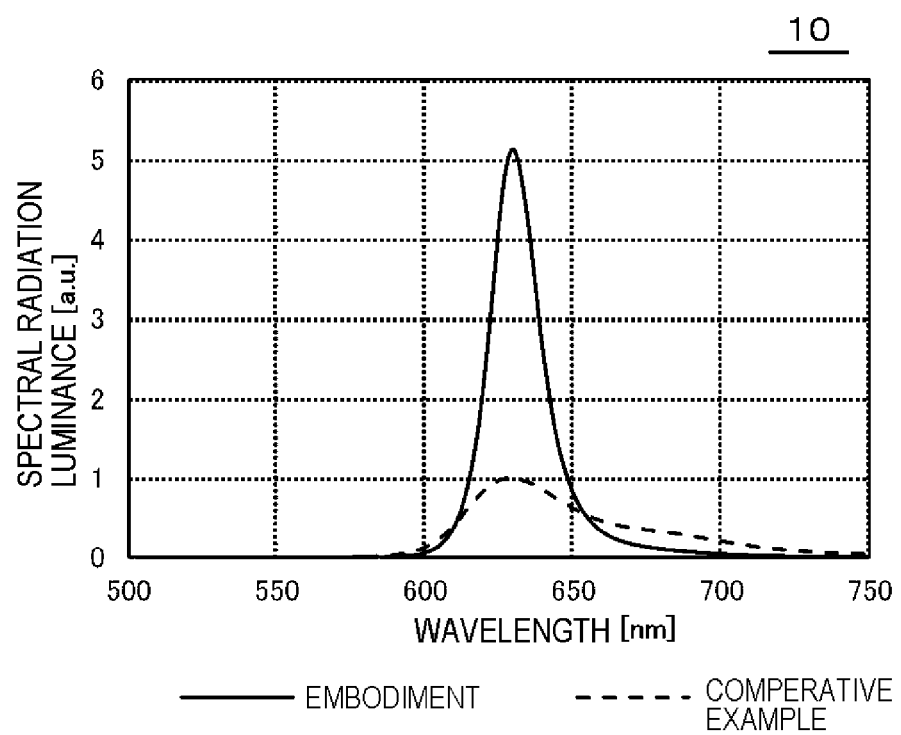
FIG. 10 is a graph showing a spectral distribution of each of a light-emitting device according to an embodiment and a light-emitting device according to a comparative example.

FIG. 10 is a graph showing a spectral distribution of each of the light-emitting device 10 according to the embodiment and the light-emitting device 10 according to the comparative example. In the example shown in the chart, the light-emitting device 10 according to the embodiment is designed so that the relationship of Formula (1) holds when $\theta_0=30$ degrees and $\Delta=630$ nm. In contrast, the light-emitting device 10 according to the comparative example is the same as the light-emitting device 10 according to the embodiment, except that the semi-transparent reflecting layer 154 is not included, that is, the resonator 150 is not configured and the width of the organic layer 120 is different from that of the embodiment.

In the example shown in the diagram, each spectral distribution is a spectral distribution when observed from a direction inclined by 30 degrees (that is, an angle which is equal to the angle $\theta_0$) from the reference direction. As shown in the graph, the wavelength at which the spectral distribution of the light-emitting device 10 according to the embodiment is a maximum value is substantially the same as the wavelength at which the spectral distribution of the light-emitting device 10 according to the comparative example is a maximum value, and is approximately 630 nm. Further, the maximum value of the spectral distribution of the light-emitting device 10 according to the embodiment is greater than the maximum value of the spectral distribution of the light-emitting device 10 according to the comparative example. As explained later, in a case where the light-emitting device 10 includes a light-transmitting unit, the area of a light-emitting region with respect to the area of the light-emitting device 10 is limited. There is a problem in achieving a light emission intensity required for the light-emitting device 10. By adopting the configuration of the light-emitting device 10 according to the present example, the intensity of the light emission can be strengthened even within the limitation of the area of the light-emitting region.

Figure 11A:
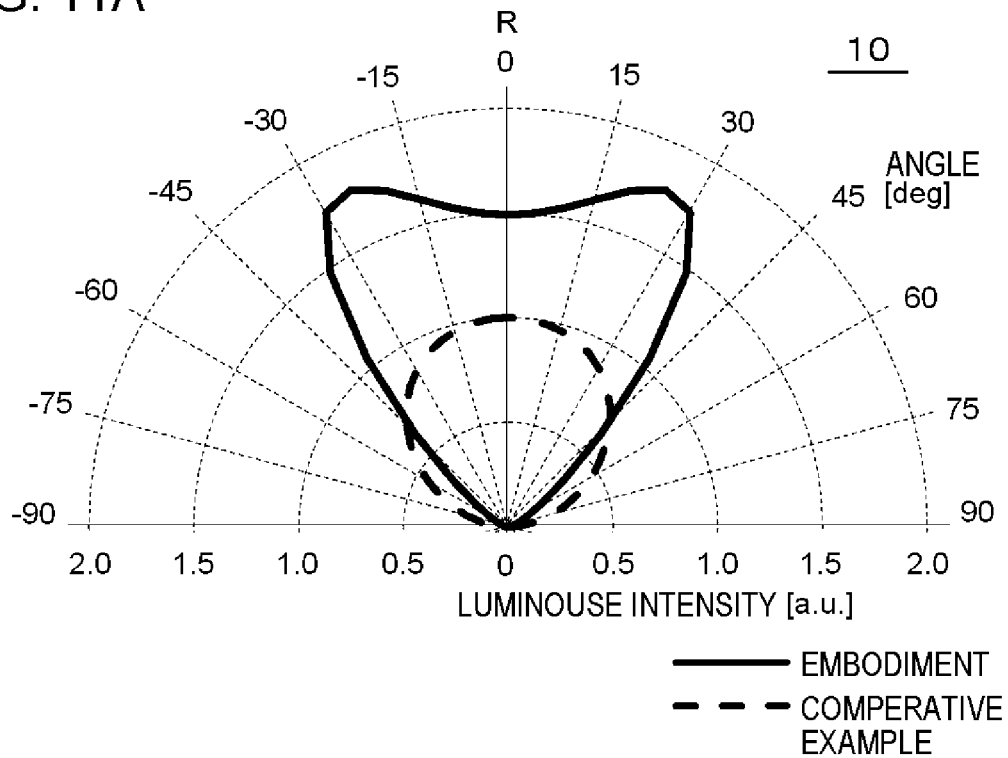
FIG. 11(a) is a graph (a distribution curve) showing a light distribution of each of a light-emitting device according to an embodiment and a light-emitting device according to a comparative example using polar coordinates.
Figure 11B:
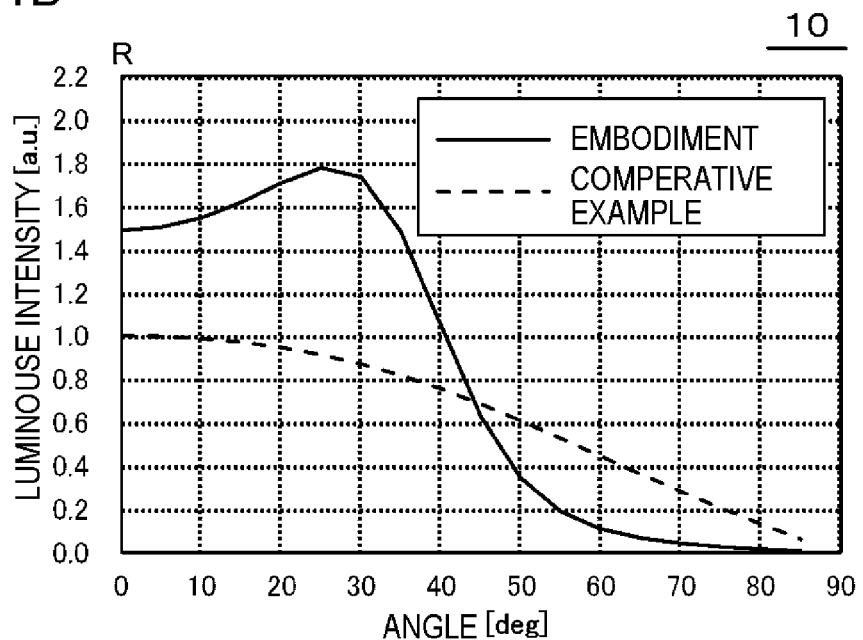
FIG. 11(b) is a graph showing each light distribution shown in FIG. 11(a) using rectangular coordinates.

FIG. 11(a) is a graph (a distribution curve) showing a light distribution of each of the light-emitting device 10 according to the embodiment and the light-emitting device 10 according to the comparative example using polar coordinates. FIG. 11(b) is a graph of each light distribution shown in FIG. 11(a) using rectangular coordinates. In the example shown in the drawing, the light-emitting device 10 which is the same as the light-emitting device 10 used in the example shown in FIG. 10 is used.

As shown in FIG. 11(a), all of the light distributions of the light-emitting device 10 according to the embodiment and the light-emitting device 10 according to the comparative example are symmetric with respect to the reference direction R. In addition, as shown in FIG. 11(b), the light distribution of the light-emitting device 10 according to the embodiment has a maximum value in the direction inclined by ±25 degrees (that is, approximately ±30 degrees) from the reference direction R. In contrast, the light distribution of the light-emitting device 10 according to the comparative example has a maximum value in the reference direction R, and the luminous intensity of the light distribution monotonically decreases as the inclination from the reference direction R becomes greater. As shown in FIG. 11 (a) and FIG. 11(b), the luminous intensity of the light distribution is asymmetric with the maximum value of the light-emitting device 10 according to the embodiment as the center. In other words, the luminous intensity of the light distribution comparatively gradually rises up to the maximum value, and after exceeding the maximum value, rapidly falls. By adopting such a configuration, the contrast of the light-emitting device 10 can be enhanced.

Figure 12A:
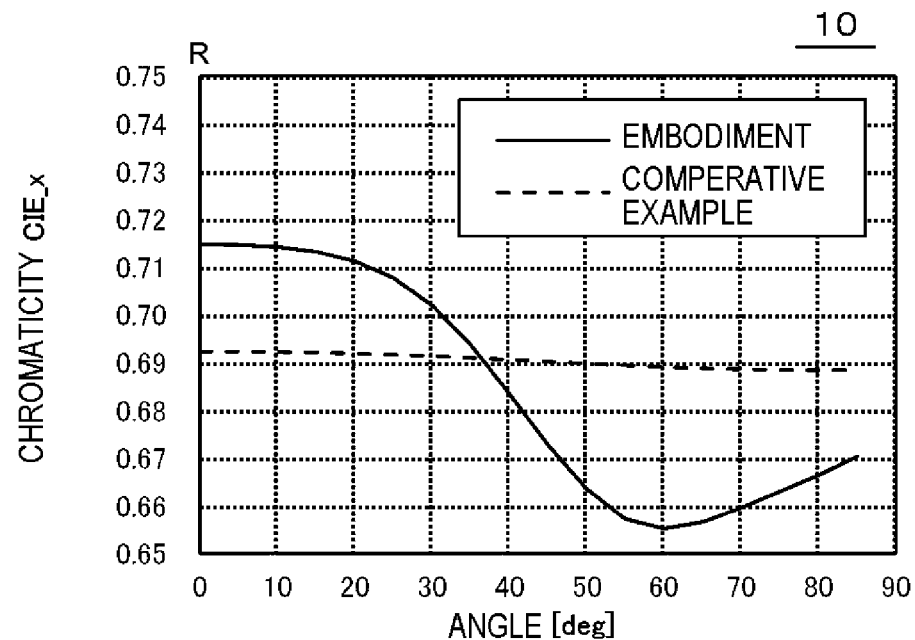
FIG. 12(a) is a graph showing an angular distribution of chromaticity (x) of each of a light-emitting device according to an embodiment and a light-emitting device according to a comparative example.
Figure 12B:
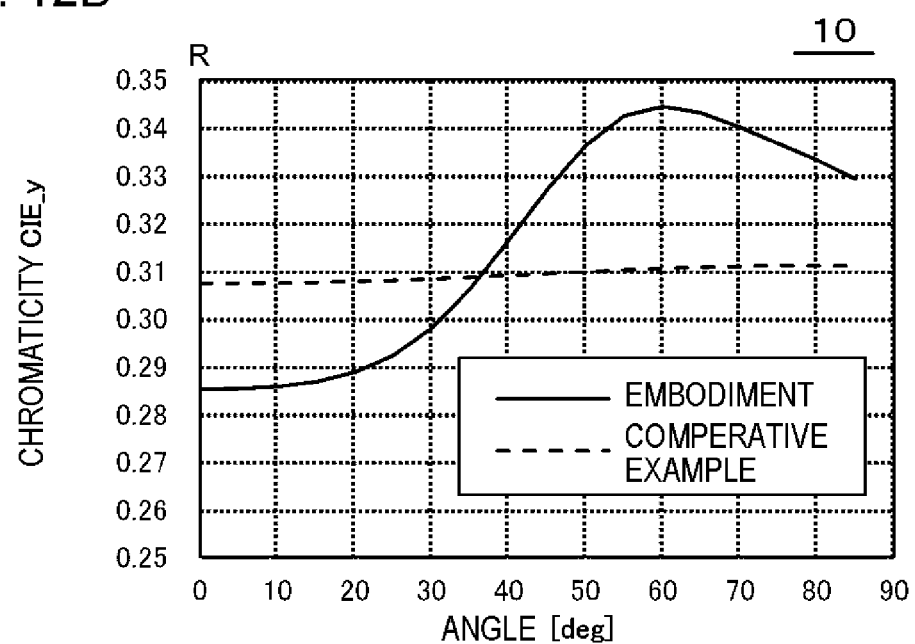
FIG. 12(b) is a graph of an angular distribution of chromaticity (y) of each of a light-emitting device according to an embodiment and a light-emitting device according to a comparative example.

FIG. 12(a) and FIG. 12(b) are graphs of the angular distribution of chromaticity of each of the light-emitting device 10 according to the embodiment and the light-emitting device 10 according to the comparative example. The chromaticity (x, y) of FIG. 12 (a) and FIG. 12 (b) is the chromaticity of the CIE 1931 color space. In the examples shown in the graphs, the light-emitting device 10 which is the same as the light-emitting device 10 used in the example shown in FIG. 10 is used.

As shown in FIG. 12(a) and FIG. 12(b), the chromaticity (x, y) of the light-emitting device 10 according to the comparative example is substantially constant regardless of the angle from the reference direction (a direction of 0 degrees in the graph). In contrast, the chromaticity (x, y) of the light-emitting device 10 according to the embodiment depends on the angle from the reference direction (a direction of 0 degrees in the graph) and varies more greatly than the chromaticity (x, y) of the light-emitting device 10 according to the comparative example. Therefore, as explained using FIG. 9, in the case of the light-emitting device 10 according to the embodiment, the light-emitting device 10 needs to be designed so as to obtain a desired chromaticity. In the example shown in the graphs, the light-emitting device 10 is designed so as to obtain the chromaticity (0.700, 0.300) at the angle of 30 degrees.

Figure 13A:
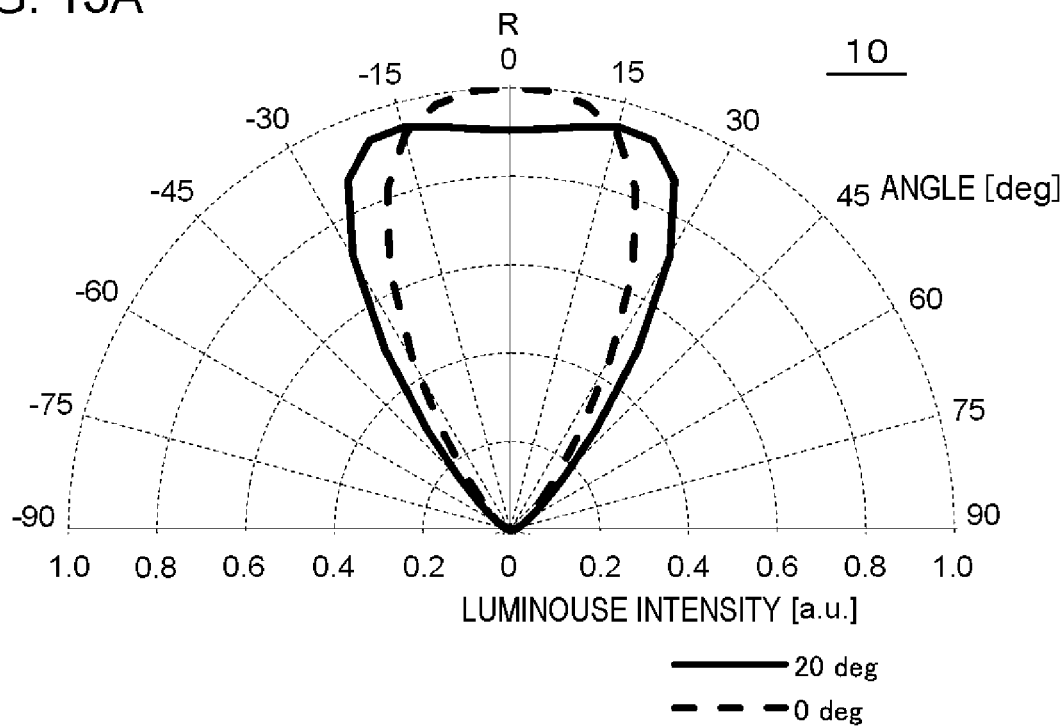
FIG. 13(a) is a graph (a distribution curve) of a light distribution of a light-emitting device according to a modification example using polar coordinates.
Figure 13B:
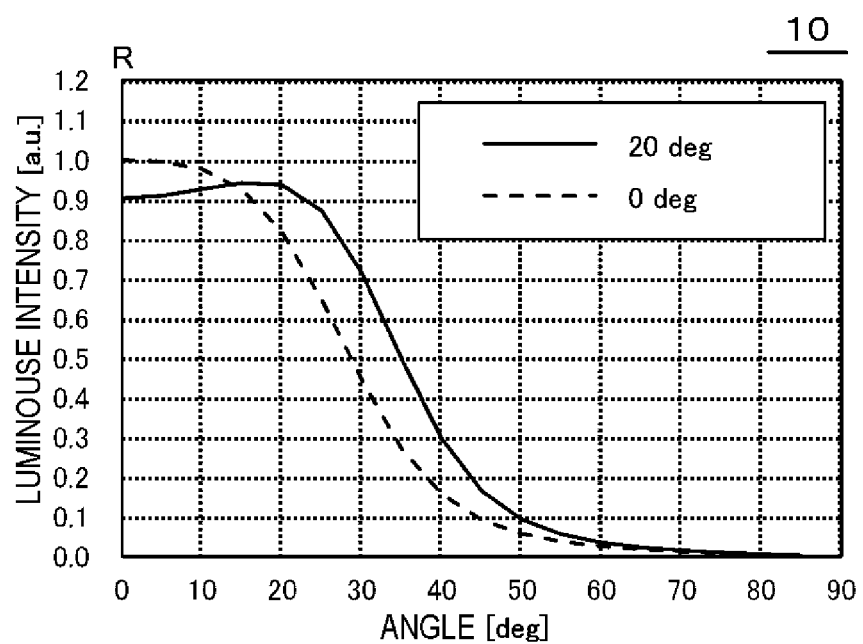
FIG. 13(b) is a graph showing a light distribution shown in FIG. 13(a) using rectangular coordinates.

FIG. 13(a) is a graph (a distribution curve) showing a light distribution of the light-emitting device 10 according to a modification example using polar coordinates. FIG. 13(b) is a graph showing the light distribution described in FIG. 13 (a) using rectangular coordinates. In the example shown in the graphs, designs are made for a light-emitting device 10 at a design angle of 0 degrees and a light-emitting device 10 at a design angle of 20 degrees.

According to the results shown by the graph, in view of increasing the range in which the light distribution has a high luminous intensity, the light-emitting device 10 is preferably designed so that the light distribution thereof has a maximum value in the direction inclined at an angle equal to or less than 20 degrees, and more preferably, equal to or less than 15 degrees from the reference direction R. As shown in the graph, the light distribution of the light-emitting device 10 at the design angle of 20 degrees in a wide range, specifically, at approximately 0 degrees to 25 degrees, has substantially the same luminous intensity as the luminous intensity of the light distribution of the light-emitting device 10 of the design angle of 0 degrees at 0 degrees. Thus, in a case where the design angle is small, the range is increased in which the light distribution has a high luminous intensity.

Meanwhile, according to the results shown in FIG. 8, in view of increasing the range in which the light distribution has a high luminous intensity, the light-emitting device 10 is preferably designed so that the light distribution has a maximum value in the direction inclined at an angle equal to or greater than 10 degrees from the reference direction R. From the results shown in FIG. 8, it may be said that the light distribution of the light-emitting device 10 at a small design angle (for example, around 5 degrees) is substantially the same as that of the light-emitting device 10 at the design angle of 0 degrees. In contrast, in a case where the light-emitting device 10 is designed so that the light distribution thereof has a maximum value in the direction inclined at an angle equal to or greater than 10 degrees from the reference direction R, the light distribution is different from that of the light-emitting device 10 at the design angle of 0 degrees.

Figure 14:
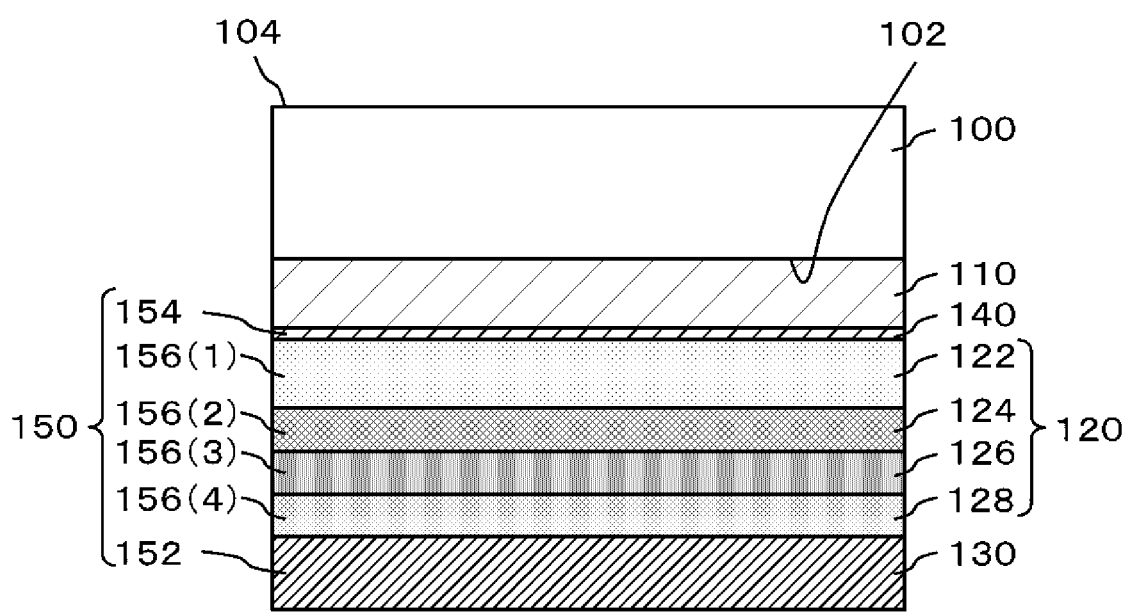
FIG. 14 is a diagram showing a first modification example of FIG. 1.

FIG. 14 is a drawing showing a first modification example of FIG. 1. As shown in the drawing, the first electrode 110 may be located between the first surface 102 of the substrate 100 and the layer 140 (the semi-transparent reflecting layer 154). In other words, in the example shown in the drawing, the first electrode 110 does not configure a resonator 150. In the example shown in the drawing, only the organic layer 120 (HIL 122, HTL 124, EML 126, and ETL 128) is between the reflecting layer 152 and the semi-transparent reflecting layer 154. The HIL 122, the HTL 124, the EML 126, and the ETL 128 function as a first layer 156 (1), a second layer 156 (2), a third layer 156 (3), and a fourth layer 156 (4), respectively.

Figure 15:
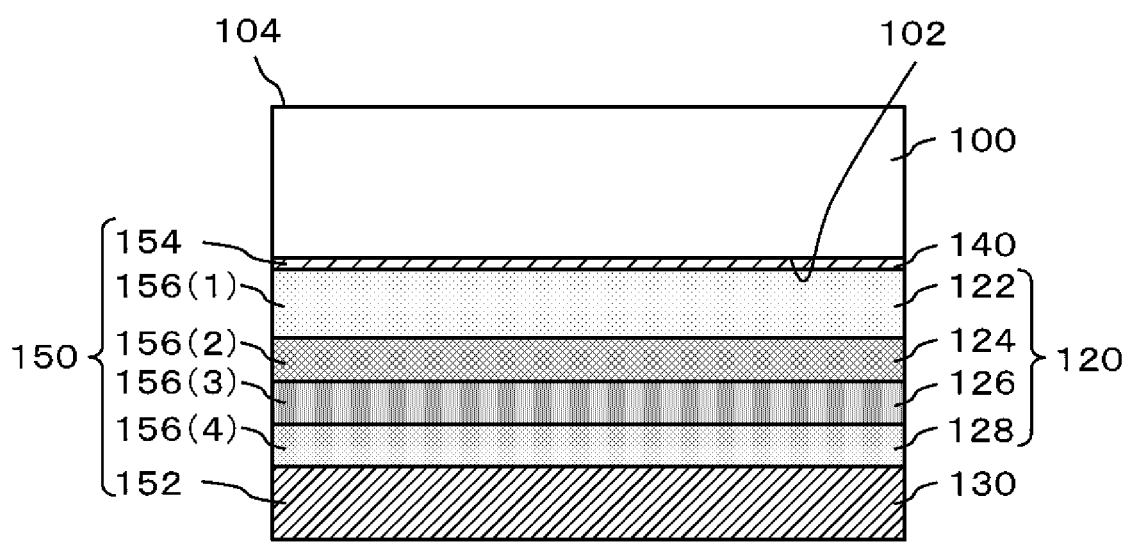
FIG. 15 is a diagram showing a second modification example of FIG. 1.

FIG. 15 is a drawing showing a second modification example of FIG. 1. As shown in the drawing, the first electrode 110 (FIG. 1) need not be included. In the example shown in the drawing, the layer 140 functions as an electrode. Specifically, the layer 140 is a conductive film, for example, a metal thin film. In addition, the thickness of the layer 140 is thin to a certain degree, and is, specifically, thin enough to allow a portion of light incident on the layer 140 to be transmitted therethrough. Thereby, the layer 140 functions as an electrode, and also as a semi-transparent reflecting layer 154.

Figure 16:
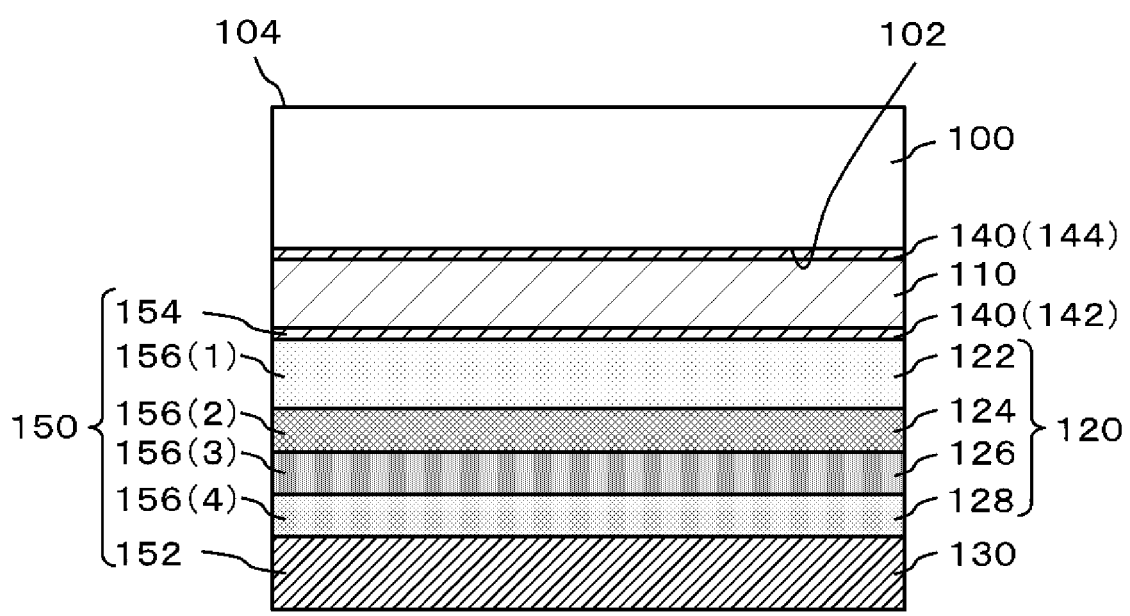
FIG. 16 is a diagram showing a third modification example of FIG. 1.

FIG. 16 is a drawing showing a third modification example of FIG. 1. As shown in the drawing, the first electrode 110 may be located between two layers (a layer 142 and a layer 144). The layer 142 is between the first electrode 110 and the organic layer 120. The layer 144 is between the first surface 102 of the substrate 100 and the first electrode 110. The layer 142 functions as a semi-transparent reflecting layer 154. The layer 144 may function as an auxiliary electrode of the first electrode 110. In such a case, the layer 144 may be formed on a portion of the first electrode 110 and the substrate 100. Therefore, in the example shown in the drawing, the first electrode 110 does not configure a resonator 150.

Figure 17A:
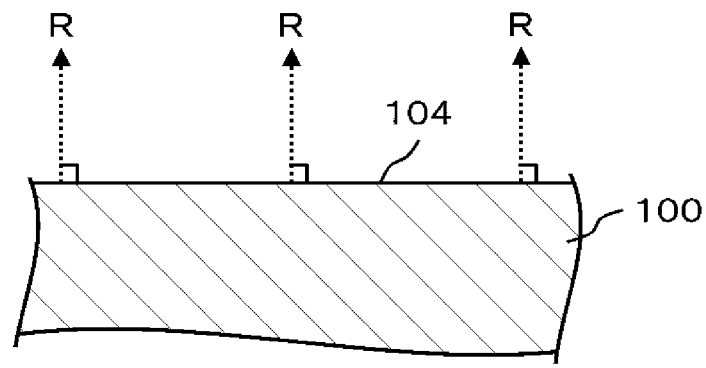
FIG. 17(a) is a diagram to explain a first example of a reference direction shown in FIG. 2.

FIG. 17(a) is a drawing explaining a first example of the reference direction R shown in FIG. 2. In the example shown in the drawing, the second surface 104 of the substrate 100 is a plane. In the example shown in the drawing, the reference direction R is a vertical direction or the normal direction of the second surface 104 of the substrate 100. Since the second surface 104 of the substrate 100 is a plane, the reference direction R is the same in all the regions in the second surface 104 of the substrate 100.

Figure 17B:
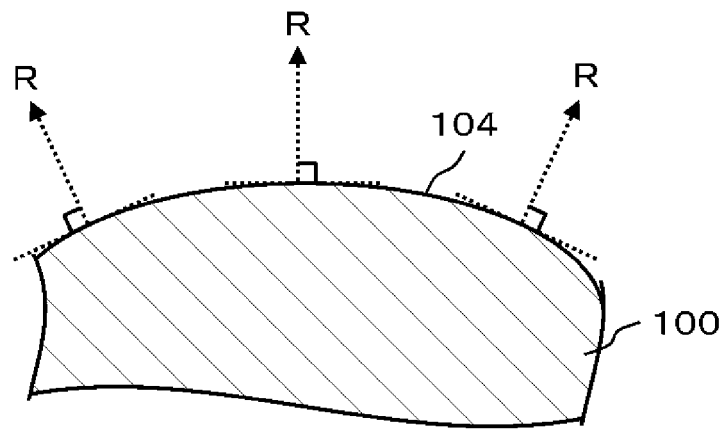
FIG. 17(b) is a diagram to explain a second example of the reference direction shown in FIG. 2.

FIG. 17(b) is a drawing explaining a second example of the reference direction R shown in FIG. 2. In the example shown in the drawing, the second surface 104 of the substrate 100 is a curved surface, and specifically, is projected outward. In the example shown in the drawing, the reference direction R is the vertical direction of a tangent of the second surface 104 of the substrate 100 or the normal direction of a tangent plane of the second surface 104 of the substrate 100. Since the second surface 104 of the substrate 100 is a curved surface, the reference direction R is different depending on the region in the second surface 104 of the substrate 100. That is, in the example shown in the drawing, the reference direction R is not limited to a certain direction.

Figure 17C:
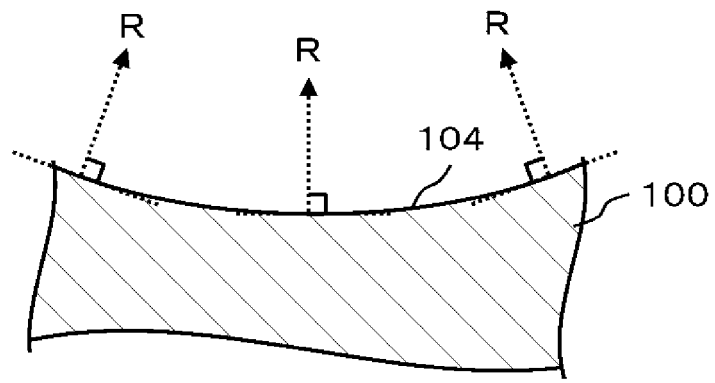
FIG. 17(c) is a diagram to explain a third example of the reference direction shown in FIG. 2.

FIG. 17(c) is a drawing explaining a third example of the reference direction R shown in FIG. 2. In the example shown in the drawing, the second surface 104 of the substrate 100 is a curved surface, and specifically, is curved convexly outward. In the example shown in the drawing, the reference direction R is the vertical direction of the tangent of the second surface 104 of the substrate 100 or the normal direction of the tangent plane of the second surface 104 of the substrate 100. Since the second surface 104 of the substrate 100 is a curved surface, the reference direction R is different depending on the region in the second surface 104 of the substrate 100. That is, in the example shown in the drawing, the reference direction R is not limited to a certain direction.

As stated above, according to the embodiment, the light distribution of light from the light-emitting device 10 is higher in luminous intensity in a direction different from the reference direction R compared to that in the reference direction R. Thus, the light distribution of light from the light-emitting device 10 has a maximum value in the direction different from the central direction of this light distribution.

Example 1

Figure 18:
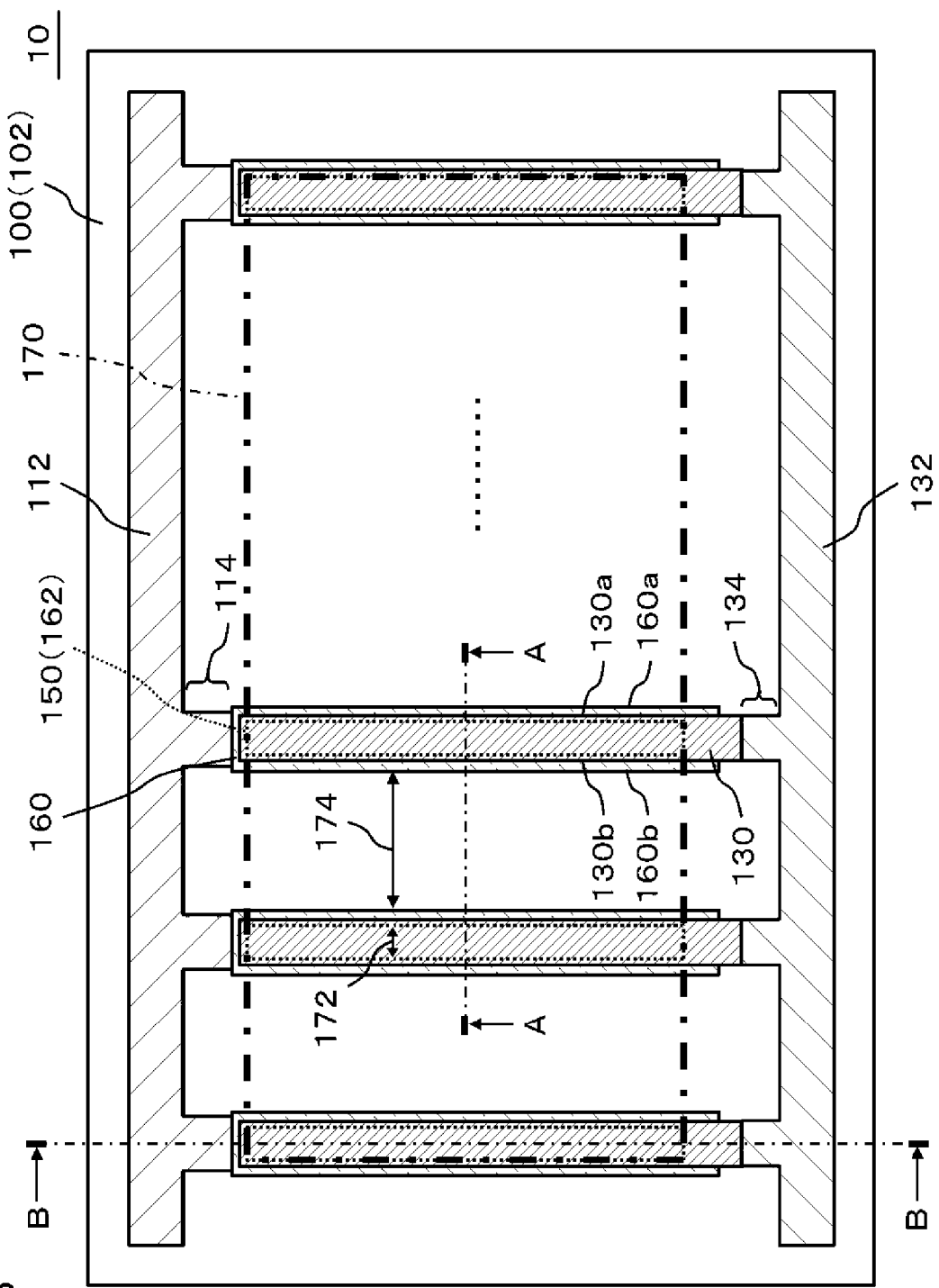
FIG. 18 is a plan view of a light-emitting device according to Example 1.
Figure 19:
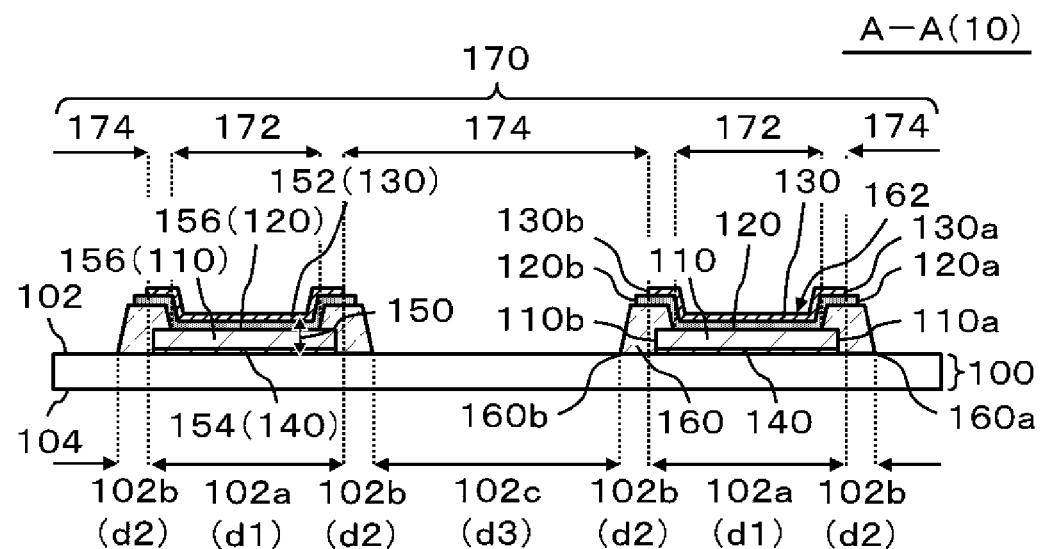
FIG. 19 is a cross-sectional view taken along line A-A of FIG. 18.
Figure 20:
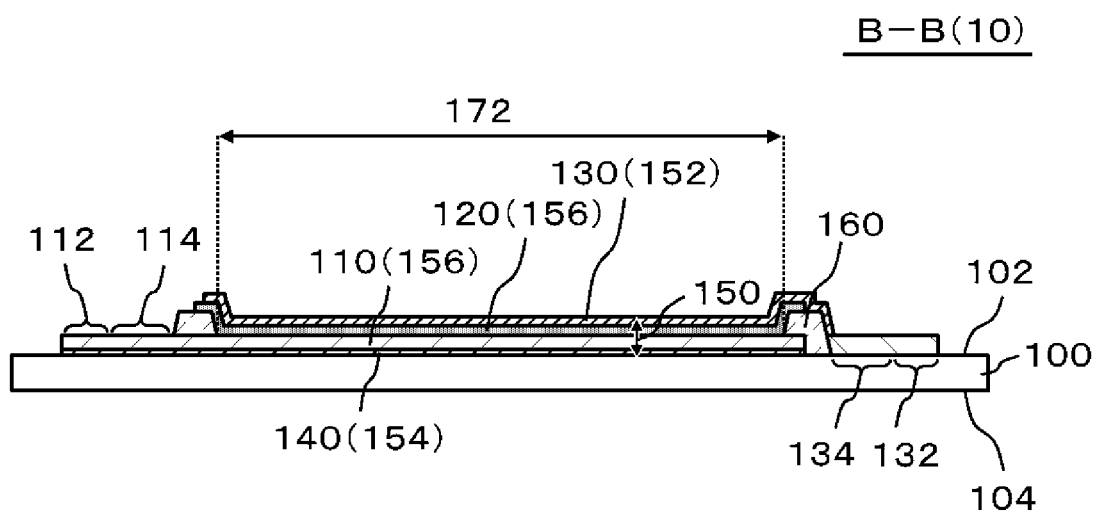
FIG. 20 is a cross-sectional view taken along line B-B of FIG. 18.

FIG. 18 is a plan view of a light-emitting device 10 according to Example 1. FIG. 19 is a cross-sectional view taken along line A-A of FIG. 18. FIG. 20 is a cross-sectional view taken along line B-B of FIG. 18. Meanwhile, FIG. 1 corresponds to an enlarged drawing of a portion of the light-emitting device 10 according to the present example. In the example shown in FIG. 19, each layer of an organic layer 120 (HIL 122, HTL 124, EML 126, and ETL 128) is not shown in the diagram for ease of explanation.

The light-emitting device 10 includes a substrate 100, a first electrode 110, a first terminal 112, a first wiring 114, an organic layer 120, a second electrode 130, a second terminal 132, a second wiring 134, a layer 140, and an insulating layer 160. The substrate 100 has light-transmitting properties. The first electrode 110 functions as a layer 156. The organic layer 120 functions as a layer 156. The second electrode 130 functions as a reflecting layer 152. The layer 140 functions as a semi-transparent reflecting layer 154. The reflecting layer 152, the semi-transparent reflecting layer 154, and the layer 156 configure a resonator 150.

The first electrode 110, the organic layer 120, the second electrode 130, and the insulating layer 160 include a first end 110a, a first end 120a, a first end 130a, and a first end 160a, respectively, and further includes a second end 110b, a second end 120b, a second end 130b, and a second end 160b, respectively. The second end 110b, the second end 120b, the second end 130b, and the second end 160b are located on the opposite sides of the first end 110a, the first end 120a, the first end 130a, and the first end 160a, respectively.

As shown in FIG. 18, the light-emitting device 10 includes a light-emitting element 170 on a first surface 102 of the substrate 100. The light-emitting element 170 includes a plurality of light-emitting units 172 and a plurality of light-transmitting units 174. The plurality of light-emitting units 172 and the plurality of light-transmitting units 174 are alternately aligned. More specifically, in light-emitting units 172 adjacent to each other, the first end 110a, the first end 120a, the first end 130a, and the first end 160a of one light-emitting unit 172 are aligned to face the second end 110b, the second end 120b, the second end 130b, and the second end 160b of the other light-emitting unit 172, respectively, through the light-transmitting unit 174.

The light-emitting unit 172 is configured of the first electrode 110, the organic layer 120, and the second electrode 130 in an opening 162 of the insulating layer 160. In other words, in the light-emitting unit 172, the first electrode 110, the organic layer 120, and the second electrode 130 overlap each other. The light-transmitting unit 174 is a region between the first end 130a of one second electrode 130 and the second end 130b of the other second electrode 130 of the light-emitting units 172 which are adjacent to each other. Meanwhile, in the example shown in FIG. 18, the shape of the light-emitting unit 172 (the opening 162 of the insulating layer 160) is rectangular.

In the example shown in FIG. 18, the shape of the light-emitting element 170 is defined as a rectangle having a pair of long sides and a pair of short sides. Specifically, the pair of long sides of the light-emitting element 170 is overlapped with the pair of short sides of each of the plurality of light-emitting units 172. One short side of the light-emitting element 170 is overlapped with a long side on the outer side of a light-emitting unit 172 at one end out of the plurality of light-emitting units 172. The other short side of the light-emitting element 170 is overlapped with a long side on the outer side of a light-emitting unit 172 at the other end out of the plurality of light-emitting units 172.

The first terminal 112 and the second terminal 132 are located on the opposite side of each other with the light-emitting unit 172 therebetween. The first terminal 112 and the second terminal 132 extend along the long side of the light-emitting element 170. The first terminal 112 is connected to each of a plurality of first electrodes 110 through each of a plurality of first wirings 114. The second terminal 132 is connected to each of a plurality of second electrodes 130 through each of a plurality of second wirings 134. Thereby, it is possible to apply voltage from the outside to the first electrode 110 through the first terminal 112 and the first wiring 114. In addition, it is possible to apply voltage from the outside to the second electrode 130 through the second terminal 132 and the second wiring 134.

As shown in FIG. 19, the first electrode 110 is located over the first surface 102 of the substrate 100 with the layer 140 interposed therebetween. The insulating layer 160 is located over the first surface 102 of the substrate 100 so that a portion of the first electrode 110 is exposed from the opening 162 of the insulating layer 160. The insulating layer 160 is formed using an organic insulating material, specifically, for example, a polyimide. The organic layer 120 is located over the first electrode 110 and the insulating layer 160 so that a portion thereof is embedded in the opening 162. The second electrode 130 is located over the organic layer 120 so that a portion thereof is embedded in the opening 162. Thus, the first electrode 110, the organic layer 120, and the second electrode 130 overlap each other in the opening 162 of the insulating layer 160, and configure the light-emitting unit 172. In other words, the insulating layer 160 defines the light-emitting unit 172. In addition, the light-emitting element 170 may include a conductive unit which functions as an auxiliary electrode of the first electrode 110, and in such a case, the conductive unit is preferably formed between the first electrode 110 and the insulating layer 160 and covered by the insulating layer 160.

The first end 110a and the second end 110b of the first electrode 110 are located further on the inner side than the first end 160a and the second end 160b of the insulating layer 160, respectively. Therefore, the first end 110a and the second end 110b of the first electrode 110 are not exposed from the insulating layer 160. Thereby, the first electrode 110 and the second electrode 130 are inhibited from short-circuiting.

In the example shown in the drawing, the first end 120a and the second end 120b of the organic layer 120 are located further on the inner side than the first end 160a and the second end 160b of the insulating layer 160, respectively. In other words, the width of the organic layer 120 is small to a certain degree. Therefore, it is possible to make the width of a portion of the organic layer 120 which is outside of the light-emitting unit 172 narrow. That is, it is possible to make the width of a portion which does not function as a portion of the light-emitting unit 172 narrow.

In the example shown in the drawing, the first end 130a and the second end 130b of the second electrode 130 are located further on the inner side than the first end 160a and the second end 160b of the insulating layer 160, respectively, and further on the inner side than the first end 120a and the second end 120b of the organic layer 120, respectively. Thus, in the example shown in the drawing, the width of the outer portion of the light-emitting unit 172, that is, the light-transmitting unit 174, is broad.

In the example shown in FIG. 19, the first surface 102 of the substrate 100 includes a first region 102a, a second region 102b, and a third region 102c. The first region 102a is a region from the first end 130a to the second end 130b of the second electrode 130. The second region 102b is a region from the first end 130a of the second electrode 130 to the first end 160a of the insulating layer 160 and a region from the second end 130b of the second electrode 130 to the second end 160b of the insulating layer 160. The third region 102c is a region from the first end 160a of the insulating layer 160 of one light-emitting unit 172 out of light-emitting units 172 adjacent to each other to the second end 160b of the insulating layer 160 of the other light-emitting unit 172.

In the example shown in FIG. 19, in a direction from one light-emitting unit 172 toward the other light-emitting unit 172, a distance between the first end 130a of the second electrode 130 (a first reflection electrode) and the first end 160a of the insulating layer 160 (that is, a width d2 of the second region 102b) is shorter than a distance between the first end 160a of the insulating layer 160 of the one light-emitting unit 172 and the second end 160b of the insulating layer 160 of the other light-emitting unit 172 (that is, a width d3 of the third region 102c). In addition, in a direction from the other light-emitting unit 172 toward the one light-emitting unit 172, a distance between the second end 130b of the second electrode 130 (a second reflection electrode) and the second end 160b of the insulating layer 160 (that is, the width d2 of the second region 102b) is shorter than a distance between the second end 160b of the insulating layer 160 of the other light-emitting unit 172 and the first end 160a of the insulating layer 160 of the one light-emitting unit 172 (that is, the width d3 of the third region 102c). Thereby, the light transmittance of the light-emitting device 10 is high.

In detail, the light transmittance of the second region 102b is lower than that of the third region 102c. This is due to the insulating layer 160 being located in the second region 102b, while the insulating layer 160 is not located in the third region 102c. As described above, the width d2 of the second region 102b is narrower than the width d3 of the third region 102c. Therefore, the light transmittance of the light-emitting device 10 is high.

Further, in the example shown in FIG. 19, the light-emitting device 10 is inhibited from functioning as a filter to shield light of a specific wavelength. In detail, there is a case where a light transmittance of the insulating layer 160 differs depending on the wavelength. Therefore, the insulating layer 160 may function as a filter to shield light of a specific wavelength. In the example shown in the drawing, as described above, the width d2 of the second region 102b (a region overlapping the insulating layer 160) is narrow, and specifically, narrower than the width d3 of the third region 102c. Therefore, the light-emitting device 10 is inhibited from functioning as a filter to shield light of a specific wavelength.

In the example shown in FIG. 19, the width d2 of the second region 102b is, for example, equal to or greater than 0 times and equal to or less than 0.2 times of the width d1 of the first region 102a ($0 \leq d2/d1 \leq 0.2$). The width d3 of the third region 102c is, for example, equal to or greater than 0.3 times and equal to or less than 2 times of the width d1 of the first region 102a ($0.3 \leq d3/d1 \leq 2$). The width d1 of the first region 102a is, for example, equal to or greater than 50 µm and equal to or less than 500 µm. The width d2 of the second region 102b is, for example, equal to or greater than 0 µm and equal to or less than 100 µm. The width d3 of the third region 102c is equal to or greater than 15 µm and equal to or less than 1,000 µm.

In the present example, light from the light-emitting element 170, more specifically, from the light-emitting unit 172 is hardly emitted to a region on the first surface 102 side of the substrate 100, but is emitted to a region on the second surface 104 side of the substrate 100. This is due to light from the organic layer 120, specifically, the EML 126 shown in FIG. 1 and FIG. 2 being reflected by the second electrode 130 (the reflecting layer 152).

In addition, in the present example, light appears to be emitted across the whole surface of the light-emitting element 170 to the human eye. This is due to a plurality of light-emitting elements 170 being disposed at a narrow pitch.

In addition, in the present example, an object is viewed through the light-emitting device 10 by the human eye. In other words, the light-emitting device 10 functions as a semi-transparent OLED. This is due to the width of the second electrode 130 (the reflecting layer 152) being narrow to a certain degree and the light-transmitting unit 174 being located between the second electrodes 130 (the reflecting layers 152) adjacent to each other. Specifically, in a case where light is not emitted from the light-emitting element 170, an object on the first surface 102 side can be viewed by the human eye from the second surface 104 side through the light-emitting device. In addition, in either of a case where light is emitted from the light-emitting element 170 and a case where light is not emitted from the light-emitting element 170, an object on the second surface 104 side can be seen through the light-emitting device from the first surface 102 side by the human eye.

Figure 21:
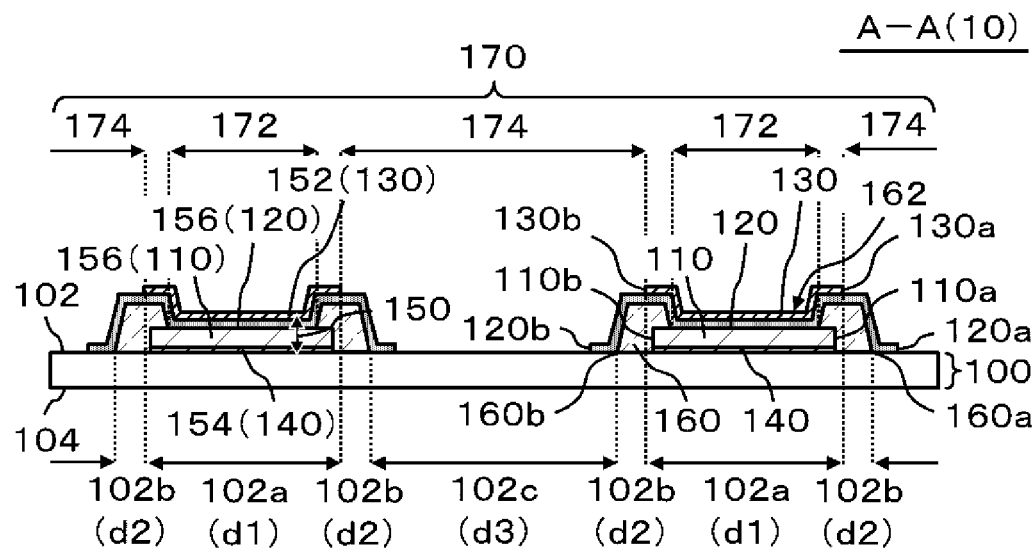
FIG. 21 is a diagram of a first modification example of FIG. 19.

FIG. 21 is a drawing showing a first modification example of FIG. 19. In the example shown in the drawing, the first end 120a and the second end 120b of the organic layer 120 may be located further on the outer side than the first end 160a and the second end 160b of the insulating layer 160, respectively.

Figure 22:
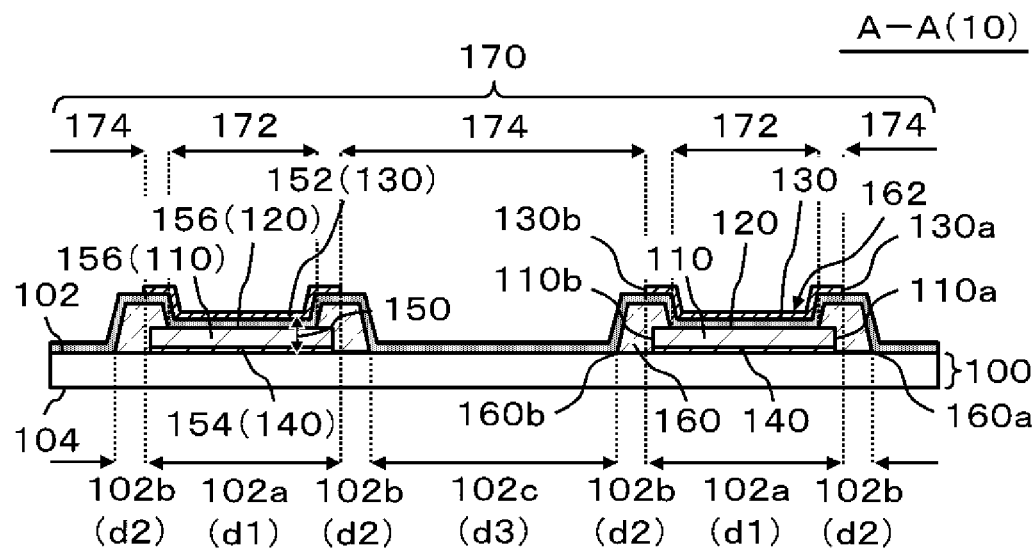
FIG. 22 is a diagram of a second modification example of FIG. 19.

FIG. 22 is a drawing showing a second modification example of FIG. 19. In the example shown in the drawing, the organic layer 120 may extend across the two light-emitting units 172 adjacent to each other. More specifically, the organic layer 120 extends across the entire surface of the light-emitting element 170. In the example shown in the drawing, each of a plurality of organic layers 120 need not be formed on each of the plurality of first electrodes 110. Therefore, the alignment to form the organic layer 120 is facilitated. Further, by adopting such a configuration, a mask need not be washed when forming plural layers of the organic layers 120, thus reducing manufacturing steps. In addition, in the present invention, since the light-emitting direction of the light-emitting unit 172 changes depending on the film thickness of the organic layer 120, it is important to prevent nonuniformity in film formation. By eliminating a mask and performing vapor deposition over the light-emitting unit 172 and the light-transmitting unit 174 of the light-emitting element 170, nonuniform film formation of the organic layer 120 can be prevented, the nonuniform film formation caused by the mask, deviation of the mask, warping of the mask, and the like caused by the film forming environment of the organic layer 120, and a light emission with a high light emission intensity at a desired angle may be obtained with higher accuracy. Further, also in a case where a portion or an entirety of the organic layer 120 is deposited by a coating process, the organic layer 120 may be easily formed when the organic layer 120 is shaped to extend across the entire surface of the light-emitting element 170.

Example 2

Figure 23:
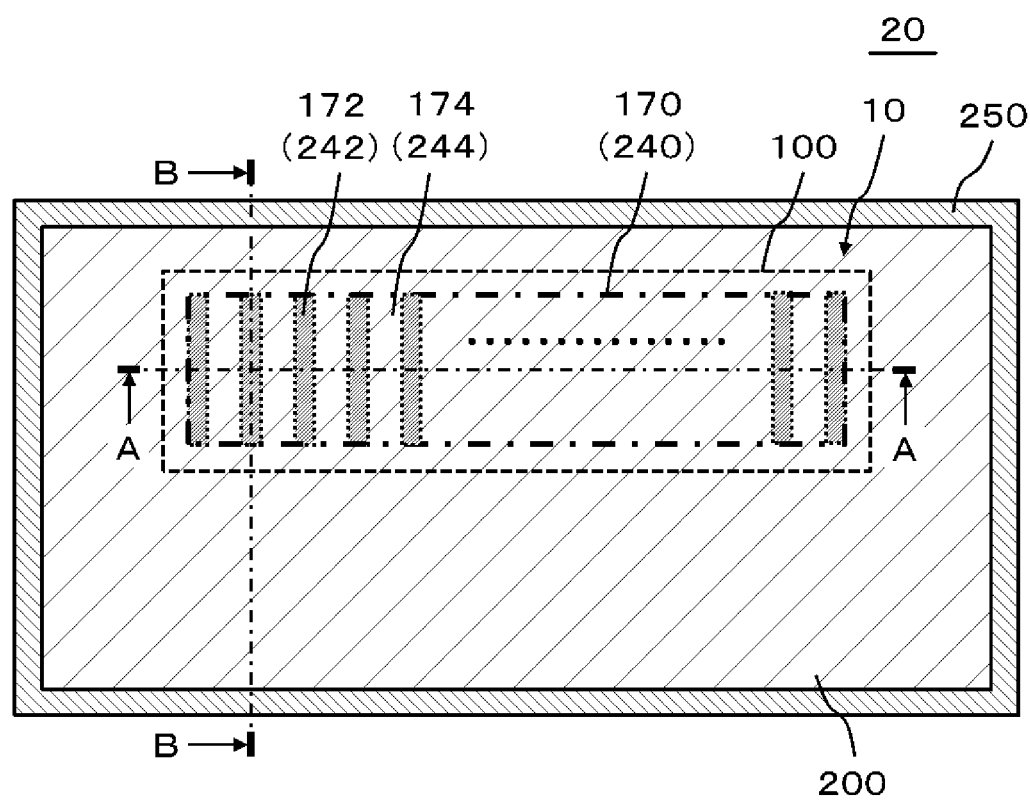
FIG. 23 is a diagram of a light-emitting system according to Example 2.
Figure 24:
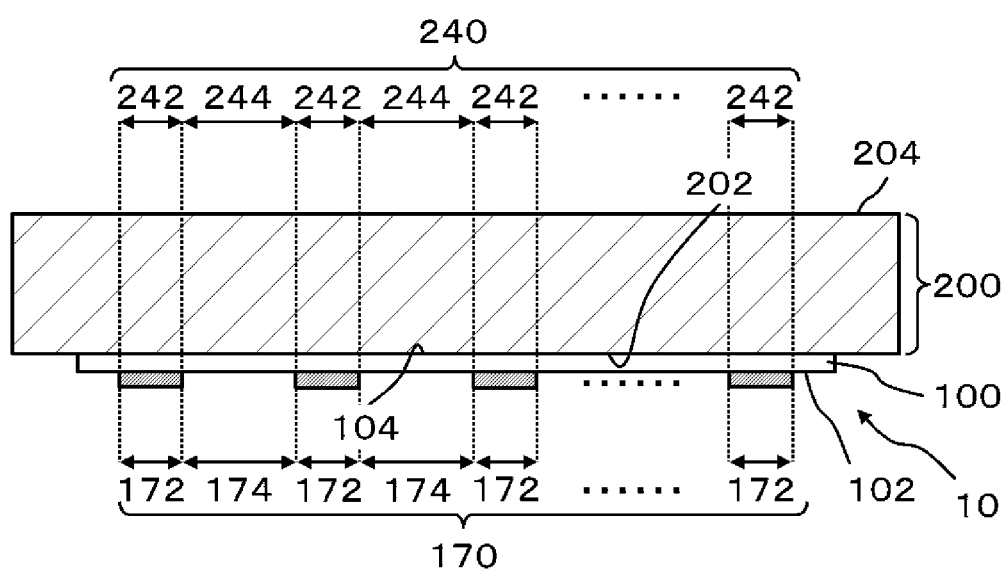
FIG. 24 is a cross-sectional view taken along line A-A of FIG. 23.
Figure 25:
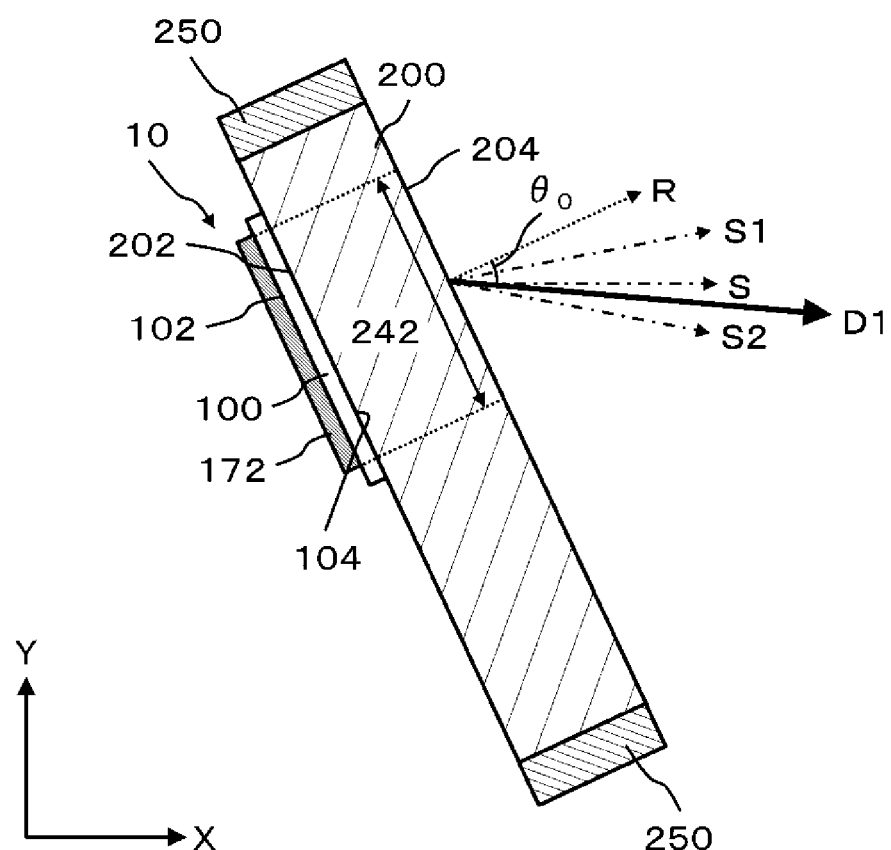
FIG. 25 is a cross-sectional view taken along line B-B of FIG. 23.

FIG. 23 is a drawing showing a light-emitting system 20 according to Example 2. FIG. 24 is a cross-sectional view taken along line A-A of FIG. 23. FIG. 25 is a cross-sectional view taken along line B-B of FIG. 23. The light-emitting system 20 includes a light-emitting device 10, a base material 200, and a frame body 250.

The light-emitting device 10 according to the present example is the same as the light-emitting device 10 according to Example 1. The light-emitting device 10 is mounted on the base material 200. Specifically, the base material 200 includes a first surface 202 and a second surface 204. The second surface 204 is on the opposite side of the first surface 202. The light-emitting device 10 is mounted on the first surface 202 of the base material 200 so that a second surface 104 of a substrate 100 faces the first surface 202 of the base material 200. Meanwhile, in FIG. 23 to FIG. 25, the first electrode 110, the organic layer 120, the second electrode 130, the layer 140, and the insulating layer 160 are not shown for ease of explanation.

The base material 200 has light-transmitting properties. Therefore, light from the light-emitting unit 172 can be transmitted through the base material 200, and specifically, the light enters the first surface 202 of the base material 200 to the base material 200 and is emitted to the outside of the base material 200 through the second surface 204 of the base material 200.

The base material 200 is held by the frame body 250. In one example, the base material 200 functions as a window or a portion thereof. More specifically, in one example, the base material 200 functions as a window of a mobile object (for example, an automobile, a train, a ship, or an airplane), more specifically, a rear window of an automobile. In another example, the base material 200 functions as a window of a case for storing an object such as a commercial product (for example, a showcase) or a window of a house or a shop or a portion of the window. In a case where the base material 200 functions as a window, the base material 200 is required to be sturdy to a certain degree. Therefore, the thickness of the base material 200 is considerably thicker than that of the substrate 100, for example, equal to or greater than 2 mm and equal to or less than 50 mm.

The base material 200 includes a semi-transparent light-emitting region 240. The semi-transparent light-emitting region 240 includes a plurality of light-emitting regions 242 and a plurality of light-transmitting regions 244. The semi-transparent light-emitting region 240 is overlapped with a light-emitting element 170 of the light-emitting device 10. The light-emitting region 242 is overlapped with the light-transmitting unit 174 of the light-emitting device 10. In other words, the light-transmitting region 244 is not overlapped with the light-emitting unit 172 of the light-emitting device 10. Thus, the plurality of light-emitting regions 242 and the plurality of light-transmitting regions 244 are alternately aligned, as is the case with the plurality of the light-emitting units 172 and the plurality of the light-transmitting units 174.

As is the case with Example 1, light appears to be emitted across the whole surface of the semi-transparent light-emitting region 240 (the light-emitting element 170) to the human eye. In addition, an object is viewed through the semi-transparent light-emitting region 240 by the human eye. In other words, the semi-transparent light-emitting region 240 functions as a semi-transparent OLED. Specifically, in a case where light is not emitted from the semi-transparent light-emitting region 240 (the light-emitting element 170), an object on the first surface 202 side can be viewed through the light-emitting device by the human eye from the second surface 204 side. In addition, in either of a case where light is emitted from the semi-transparent light-emitting region 240 (the light-emitting element 170) and a case where light is not emitted from the semi-transparent light-emitting region 240 (the light-emitting element 170), an object on the second surface 204 side can be viewed from the first surface 202 side through the light-emitting device by the human eye. Further, the light-emitting system 20 may be mounted, in a case where the base material 200 is formed in the mobile object, without hindering the visibility of a passenger, particularly a driver, a steerer, and a pilot to the outside of the mobile object and the visibility of a shop clerk of a shop to the outside in a case where the base material 200 is a shop window.

In the example shown in FIG. 25, a standard direction S is a horizontal direction (a direction along X direction in the drawing). The base material 200 is supported by the frame body 250 so that the second surface 204 of the base material 200 is oriented obliquely upward from the standard direction S. Thereby, the reference direction R is oriented obliquely upward from the standard direction S. In addition, the thickness direction of the substrate 100, the thickness direction of the light-emitting unit 172, and the thickness direction of the base material 200 are oriented obliquely upward from the standard direction S. The reference direction R is a central direction of light distribution, and in the example shown in the drawing, for example, is a direction which is along any of the thickness direction of the substrate 100, the thickness direction of the light-emitting unit 172, and the thickness direction of the base material 200, or a normal direction of the second surface 204. In a first direction D1, the light distribution of light from the light-emitting region 242 (more specifically, the light-emitting unit 172) has a higher luminous intensity in the first direction D1 compared to that in the reference direction R, and specifically, the light distribution of light from the light-emitting region 242 has a maximum value in the first direction D1. Meanwhile, the standard direction S is not limited to the horizontal direction. For example, the standard direction S may be inclined from the horizontal direction.

In the example shown in the drawing, the first direction D1 is different from the reference direction R. Therefore, even when the base material 200 is inclined from a specific direction (for example, the standard direction S) as shown in the drawing, the light distribution of light from the light-emitting region 242 (more specifically, the light-emitting unit 172) can have a high luminous intensity (for example, a maximum value) in a desired direction.

Further, in the example shown in the drawing, the first direction D1 is oriented in a direction different from the reference direction R, and is oriented in a direction which is substantially the same as the standard direction S. Specifically, an angle formed between the first direction D1 and the standard direction S is, for example, equal to or greater than 0 degrees and equal to or less than 5 degrees. Therefore, even when the base material 200 is inclined from the specific direction (for example, the standard direction S) as shown in the drawing, the light distribution of light from the light-emitting region 242 (more specifically, the light-emitting unit 172) can have a high luminous intensity (for example, a maximum value) in the standard direction S (in the example shown in the drawing, the horizontal direction) or in the vicinity thereof. Meanwhile, such a light distribution is accomplished by allowing an inclination angle of the base material 200 from, for example, the vertical direction (Y direction in the drawing) to match or correspond with a design angle at which the light distribution has a maximum value (for example, refer to FIG. 5 to FIG. 7).

Figure 26:
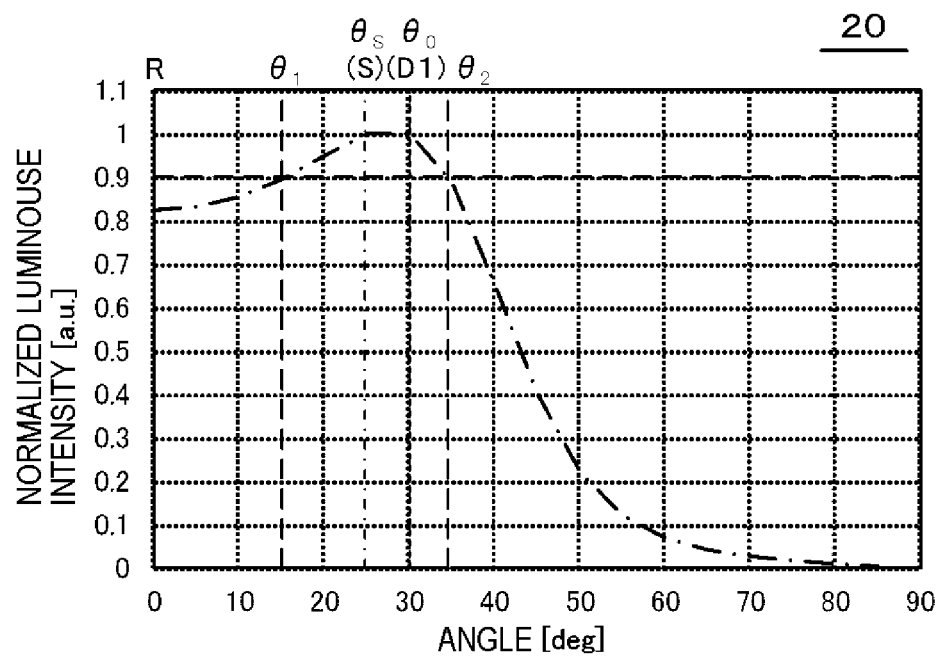
FIG. 26 is a diagram to explain an example of a light distribution of the light-emitting system shown in FIG. 25.

FIG. 26 is a graph explaining an example of the light distribution of the light-emitting system 20 shown in FIG. 25. The light distribution in the graph is a light distribution obtained by standardizing an angular distribution of the design angle of 30 degrees in FIG. 8. In the example shown in the graph, the standard direction S is the horizontal direction (a direction along X direction in FIG. 25). The reference direction R is oriented obliquely upward from the standard direction S (the horizontal direction). In the present example, the first direction D1 is oriented obliquely downward from the standard direction S (the horizontal direction).

The light distribution of light from the light-emitting region 242 (more specifically, the light-emitting unit 172) has a higher luminous intensity in a direction different from the reference direction R, specifically, for example, in the standard direction S, compared to that in the reference direction R. Therefore, even when the base material 200 is inclined from the standard direction S, the light distribution in this case has a high luminous intensity in the standard direction S.

In addition, the light distribution of light from the light-emitting region 242 (more specifically, the light-emitting unit 172) has a maximum value in the first direction D1. The first direction D1 is different from the standard direction S. Specifically, an angle formed between the first direction D1 and the reference direction R is greater than an angle formed between the standard direction S and the reference direction R. In other words, the first direction D1 is located farther from the reference direction R compared to the standard direction S, and further in other words, the standard direction S is between the reference direction R and the first direction D1.

In addition, the light distribution of light from the light-emitting region 242 (more specifically, the light-emitting unit 172) is asymmetric with respect to the first direction D1. Specifically, in the example shown in FIG. 26, this light distribution has a first luminous intensity (approximately 0.20) in a direction which is 20 degrees from the first direction D1 toward the standard direction S, and has a second luminous intensity (approximately 0.85) in a direction which is 20 degrees from the first direction D1 toward a side opposite to the standard direction S. In the example shown in FIG. 26, the first luminous intensity (approximately 0.20) is smaller than the second luminous intensity (approximately 0.85).

Further, the light distribution of light from the light-emitting region 242 (more specifically, the light-emitting unit 172) is substantially constant in the standard direction S and the vicinity thereof. Specifically, in the example shown in FIG. 26, this light distribution has a first standard luminous intensity (approximately 1.00) in the standard direction S, a second standard luminous intensity (approximately 0.90) in a direction which is 10 degrees from the standard direction S toward a first direction S1 side, and a third standard luminous intensity (approximately 0.90) in a direction which is 10 degrees from the standard direction S toward the reference direction R side. In the example shown in FIG. 26, all of the first standard luminous intensity (approximately 1.00), the second standard luminous intensity (approximately 0.90), and the third standard luminous intensity (approximately 0.90) are equal to or greater than 80% and equal to or less than 100% of the above-mentioned maximum value of the above-mentioned light distribution.

Meanwhile, also at a design angle other than 30 degrees, in a case where the first direction D1 is located farther compared to the standard direction S from the reference direction R, the light distribution of light from the light-emitting region 242 (more specifically, the light-emitting unit 172) is substantially constant in the standard direction S and the vicinity thereof (for example, refer to FIG. 8).

In addition, the angle formed between the first direction D1 and the standard direction S is not limited to the example shown in the graph. The angle formed between the first direction D1 and the standard direction S may be set to, for example, equal to or greater than 2.5 degrees and equal to or less than 12.5 degrees, preferably, for example, equal to or greater than 5.0 degrees and equal to or less than 10 degrees.

Figure 27A:
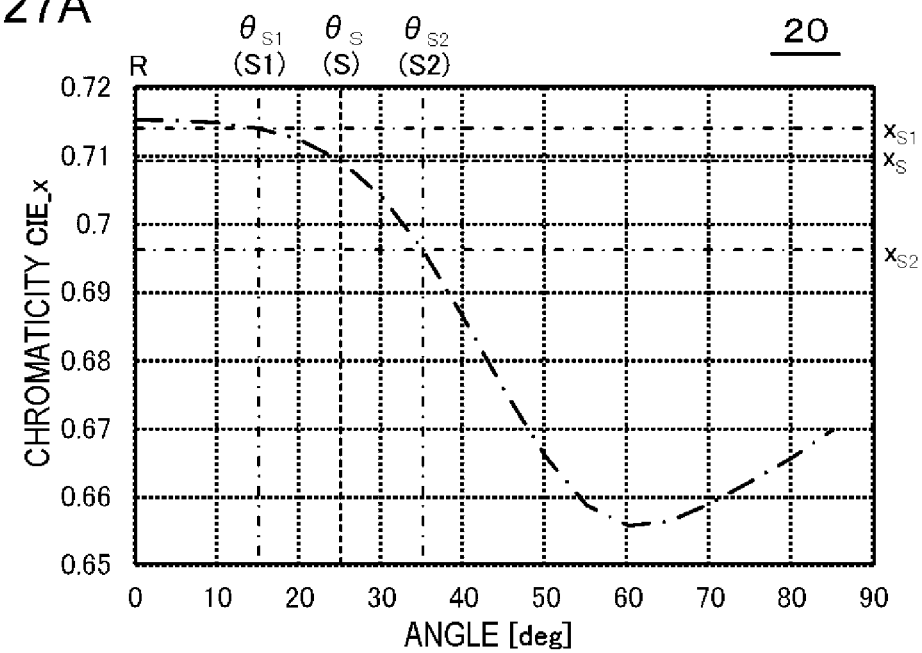
FIG. 27(a) is a diagram to explain an example of an angular distribution of chromaticity (x) of a light-emitting system shown in FIG. 25.
Figure 27B:
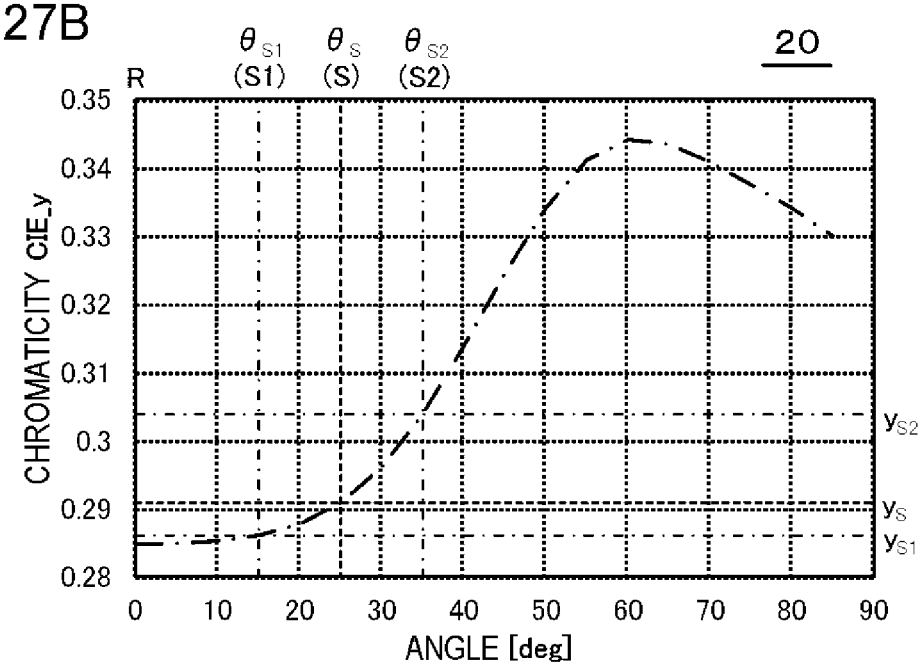
FIG. 27(b) is a diagram to explain an example of an angular distribution of chromaticity (y) of a light-emitting system shown in FIG. 25.

FIG. 27(a) and FIG. 27(b) are graphs explaining examples of the angular distribution of chromaticity of the light-emitting system 20 shown in FIG. 25. The angular distributions in FIG. 27(a) and FIG. 27(b) are the angular distributions of the design angle of 30 degrees in FIG. 9(a) and FIG. 9(b). In the example shown in the graphs, the standard direction S is the horizontal direction (the direction along X direction in FIG. 25). The first side direction S1 is oriented obliquely upward from the standard direction S (the horizontal direction). The second side direction S2 is oriented obliquely downward from the standard direction S (the horizontal direction). Meanwhile, the standard direction S is not limited to the horizontal direction. For example, the standard direction S may be inclined from the horizontal direction.

Light from the light-emitting system 20 has standard chromaticity $(x_S, y_S)$ (approximately (0.710, 0.290)) in the standard direction S ($\theta_S$: 25 degrees). Further, light from the light-emitting system 20 has a first chromaticity $(x_{S1}, y_{S1})$ (approximately (0.715, 0.285)), and a second chromaticity $(x_{S2}, y_{S2})$ (approximately (0.695, 0.305)) in the first side direction S1 ($\theta_{S1}$: 15 degrees) and the second side direction S2 ($\theta_{S2}$: 35 degrees), respectively, the first side direction S1 and the second side direction S2 being symmetric with respect to the standard direction S. A difference between the first chromaticity $(x_{S1}, y_{S1})$ and the standard chromaticity $(x_S, y_S)$ is smaller than a difference between the second chromaticity $(x_{S2}, y_{S2})$ and the standard chromaticity $(x_S, y_S)$. In other words, in the example shown in the graphs, in exchange for an increased difference between the second chromaticity $(x_{S2}, y_{S2})$ and the standard chromaticity $(x_S, y_S)$, the difference between the first chromaticity $(x_{S1}, y_{S1})$ and the standard chromaticity $(x_S, y_S)$ is made small to a certain degree.

An angle formed between the first side direction S1 and the reference direction R is smaller than an angle formed between the second side direction S2 and the reference direction R. In other words, the first side direction S1 is located closer to the reference direction R compared to the second side direction S2.

The angular distribution of a value x is concaved downward in a range of approximately ±15 degrees from the design angle (30 degrees) and decreases monotonously. Therefore, when an angle $\theta_S$ of the standard direction S, an angle $\theta_{S1}$ of the first side direction S1, and an angle $\theta_{S2}$ of the second side direction S2 are located within this range, $|x_{S1}-x_S|<|x_{S2}-x_S|$ is established. In addition, the angular distribution of a value y is convexed upward in a range of approximately ±15 degrees from the design angle (30 degrees) and increases monotonously. Therefore, when the angle $\theta_S$ of the standard direction S, the angle $\delta_{S1}$ of the first side direction S1, and the angle $\theta_{S2}$ of the second side direction S2 are located within this range, $|y_{S1}-y_S|<|y_{S2}-y_S|$ is established. Thereby, the difference between the first chromaticity $(x_{S1}, y_{S1})$ and the standard chromaticity $(x_S, y_S)$ is smaller than that between the second chromaticity $(x_{S2}, y_{S2})$ and the standard chromaticity $(x_S, y_S)$ when the angle $\theta_S$ of the standard direction S, the angle $\theta_{S1}$ of the first side direction S1, and the angle $\theta_{S2}$ of the second side direction S2 are located within the range of approximately ±15 degrees from the design angle (30 degrees).

Meanwhile, at other design angles also, a difference between upper chromaticity ($x_U$, $y_U$) and horizontal chromaticity ($x_H$, $y_H$) is smaller than that of lower chromaticity ($x_D$, $y_D$) and the horizontal chromaticity ($x_H$, $y_H$) (for example, refer to FIG. 9(a) and FIG. 9(b)) when the angle $\theta_S$ of the standard direction S, the angle $\theta_{S1}$ of the first side direction S1, and the angle $\theta_{S2}$ of the second side direction S2 are located within the range of approximately ±15 degrees from the design angle.

In addition, the angle formed between the first side direction S1 and the standard direction S (the angle formed between the second side direction S2 and the standard direction S) is not limited to the example shown in the graphs. Each of the angle formed between the first side direction S1 and the standard direction S and the angle formed between the second side direction S2 and the standard direction S is, for example, equal to or greater than 5 degrees and equal to or less than 15 degrees.

Figure 28:
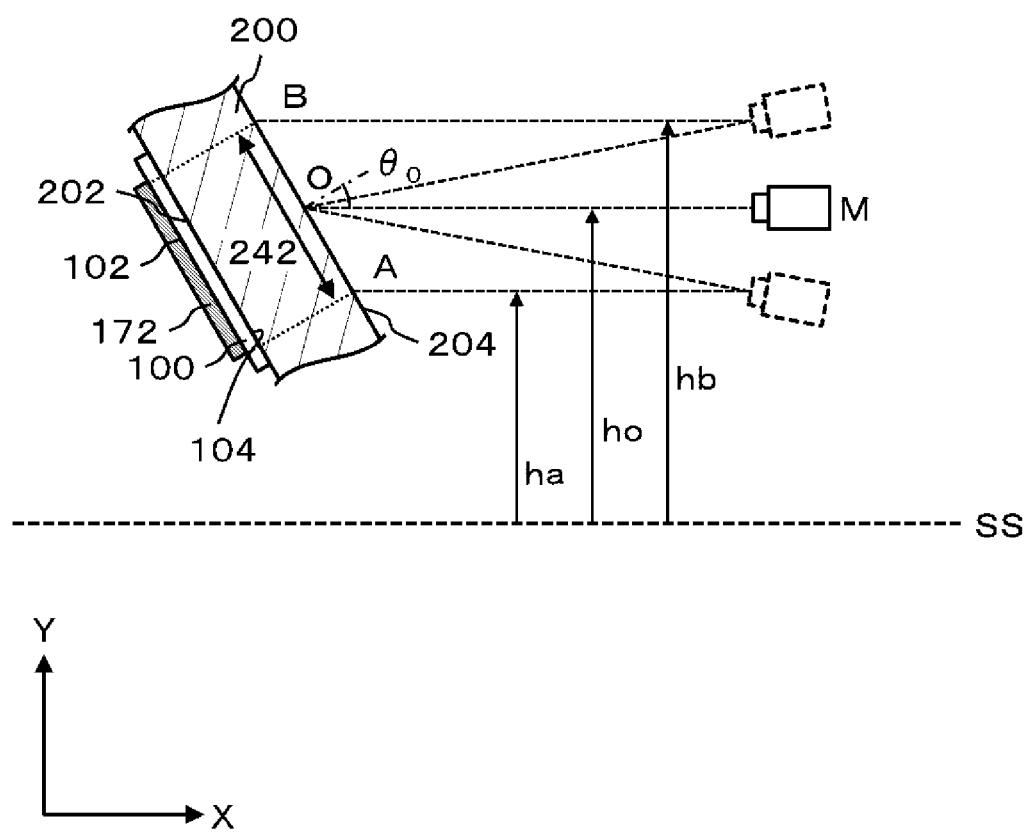
FIG. 28 is a diagram to explain a first example of a method of measuring a light distribution of light from a light-emitting region (a light-emitting unit).

FIG. 28 is a drawing explaining a first example of a method of measuring the light distribution of light from the light-emitting region 242 (the light-emitting unit 172). In the example shown in the drawing, the second surface 204 of the base material 200 is inclined from a standard surface SS. The standard surface SS is, for example, a horizontal surface. The light-emitting region 242 includes a lower end A, an upper end B, and a center O between the lower end A and the upper end B on the second surface 204. The lower end A is located at a height hA from the standard surface SS. The upper end B is located at a height hB from the standard surface SS. The center O is located at a height ho from the standard surface SS. The light distribution of light from the light-emitting region 242 (the light-emitting unit 172) has a maximum value in a direction along the standard surface SS. In a case where the light distribution of light from the light-emitting region 242 (the light-emitting unit 172) has a maximum value in the direction along the standard surface SS, the luminous intensity measured by a photometer M is the maximum in a case where the photometer M is located at the height ho, compared to when the photometer M is located at any of the other heights (for example, hA or hB).

Figure 29:
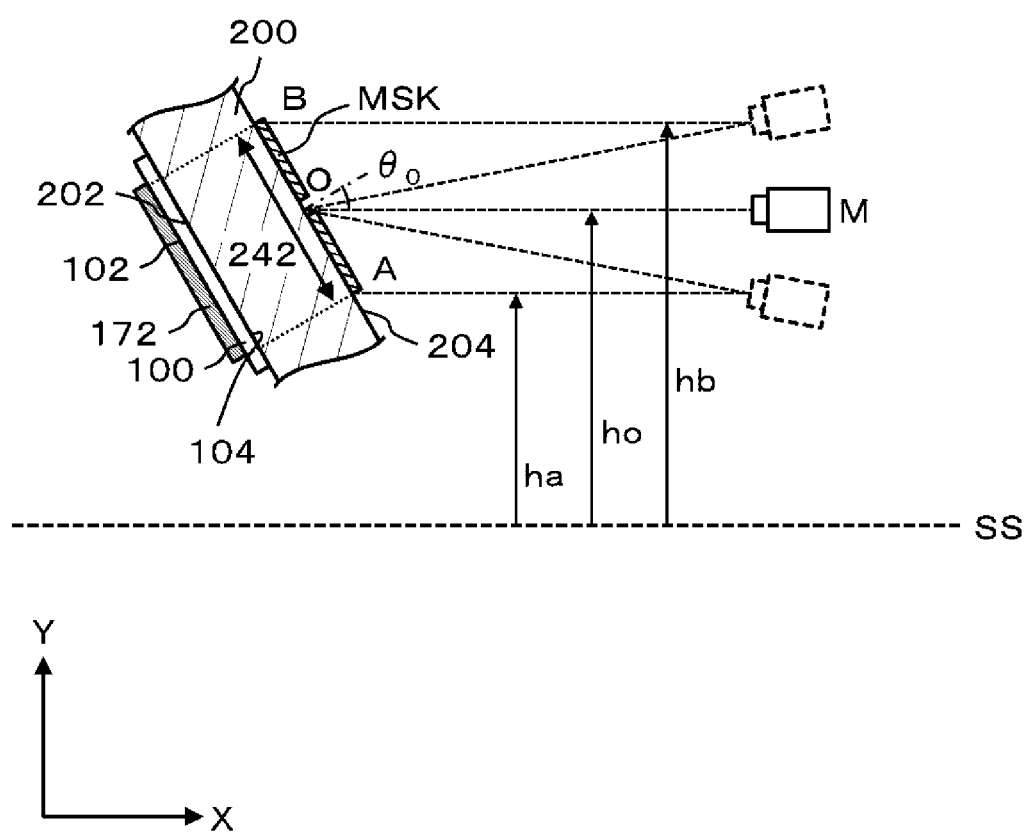
FIG. 29 is a diagram to explain a second example of a method of measuring a light distribution of light from a light-emitting region (a light-emitting unit).

FIG. 29 is a drawing explaining a second example of the method of measuring the light distribution of light from the light-emitting region 242 (the light-emitting unit 172). As shown in the drawing, the light-emitting region 242 may be covered with a mask MSK except the center O and the vicinity thereof. Thereby, the light distribution of light only from the center O and the vicinity thereof can be measured.

Figure 30:
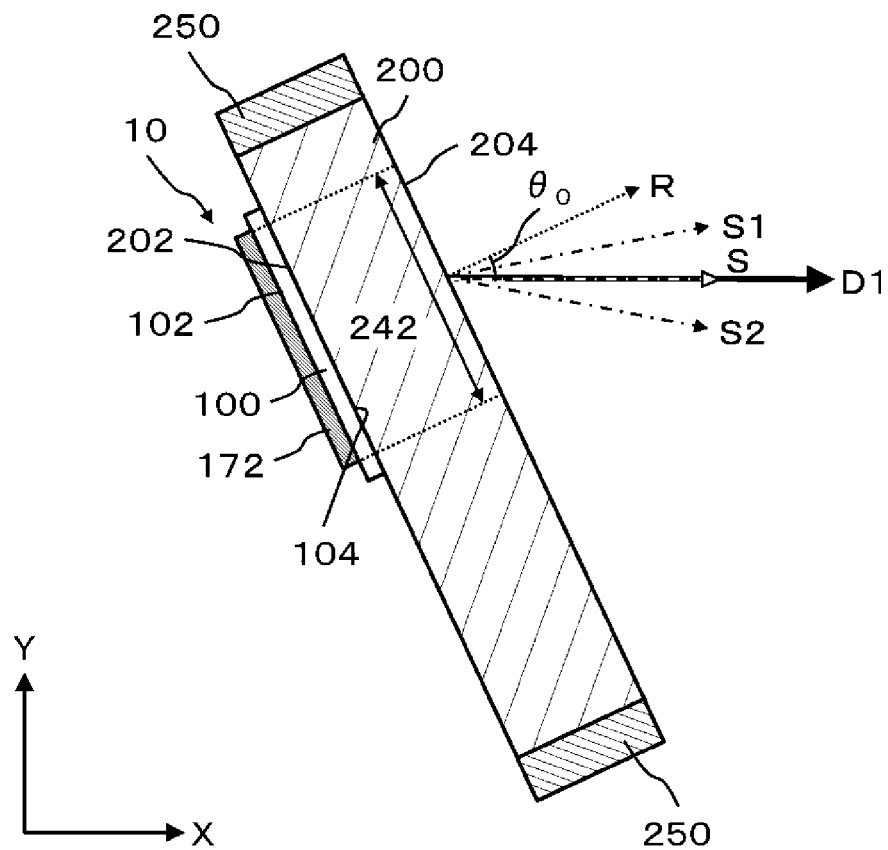
FIG. 30 is a diagram of a modification example of FIG. 25.

FIG. 30 is a drawing showing a modification example of FIG. 25. As shown in the drawing, the first direction D1 and the standard direction S may correspond to each other. In the example shown in the drawing, the light distribution of light from the light-emitting region 242 (the light-emitting unit 172) can have a maximum value in the standard direction S (for example, the horizontal direction).

Figure 31:
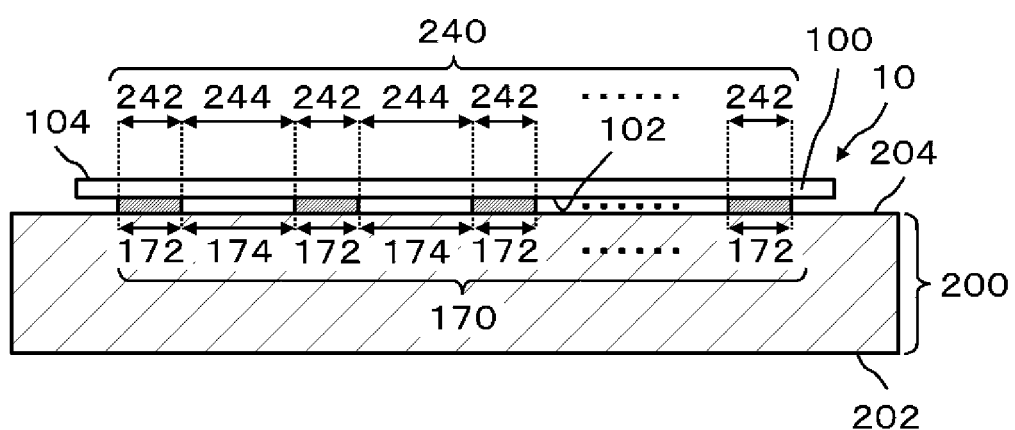
FIG. 31 is a diagram of a first modification example of FIG. 24.

FIG. 31 is a drawing showing a first modification example of FIG. 24. As shown in the drawing, the light-emitting device 10 may be mounted on the second surface 204 of the base material 200. More specifically, in the example shown in the drawing, the light-emitting device 10 is mounted on the second surface 204 of the base material 200 so that the first surface 102 of the substrate 100 faces the second surface 204 of the base material 200 with the light-emitting element 170 interposed therebetween.

Figure 32:
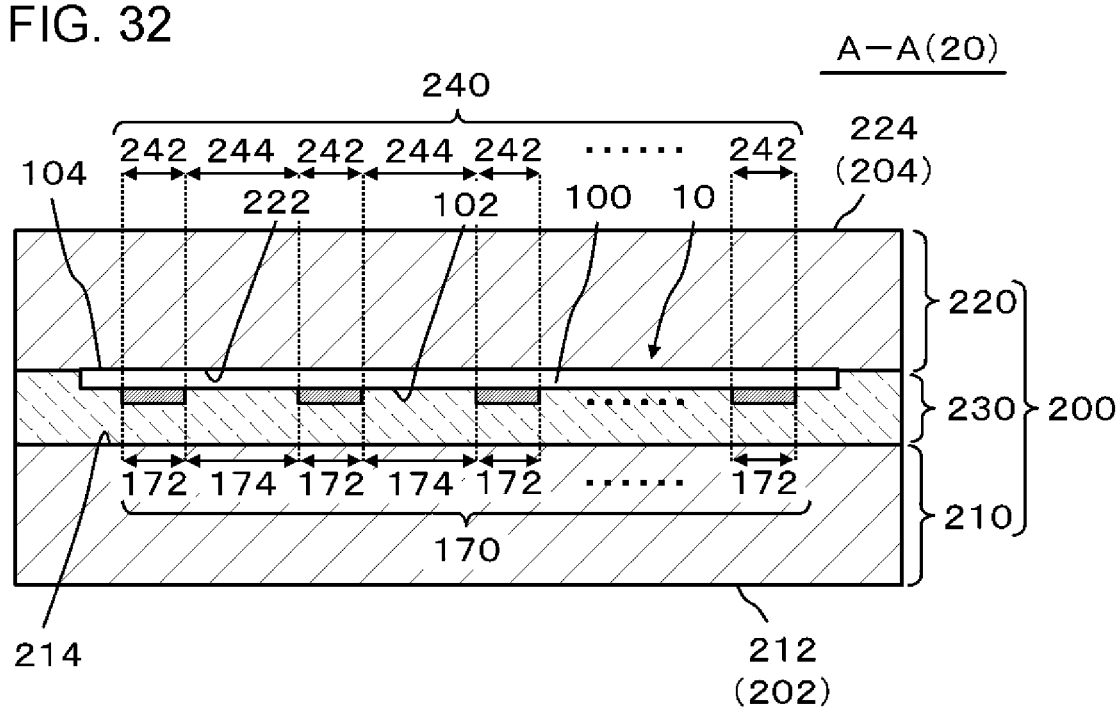
FIG. 32 is a diagram of a second modification example of FIG. 24.

FIG. 32 is a drawing showing a second modification example of FIG. 24. As shown in the drawing, the light-emitting device 10 may be inside the base material 200. Specifically, in the example shown in the drawing, the base material 200 includes a first base material 210, a second base material 220, and an intermediate layer 230. The first base material 210 and the second base material 220 are, for example, glass plates. The intermediate layer 230 is, for example, a resin layer. Thereby, the base material 200 may function as laminated glass.

The first base material 210 includes a surface 212 and a surface 214. The surface 212 functions as the first surface 202 of the first base material 210. The surface 214 is on the opposite side of the surface 212. The second base material 220 includes a surface 222 and a surface 224. The surface 224 is on the opposite side of the surface 222 and functions as the second surface 204. The surface 214 of the first base material 210 and the surface 222 of the second base material 220 face each other with the light-emitting device 10 and the intermediate layer 230 interposed therebetween. More specifically, the light-emitting device 10 is mounted on the surface 222 of the second base material 220 so that the first surface 102 of the substrate 100 faces the surface 222 of the second laminated film 220. The first surface 102 of the substrate 100 and the light-emitting element 170 are covered with the intermediate layer 230.

Figure 33:
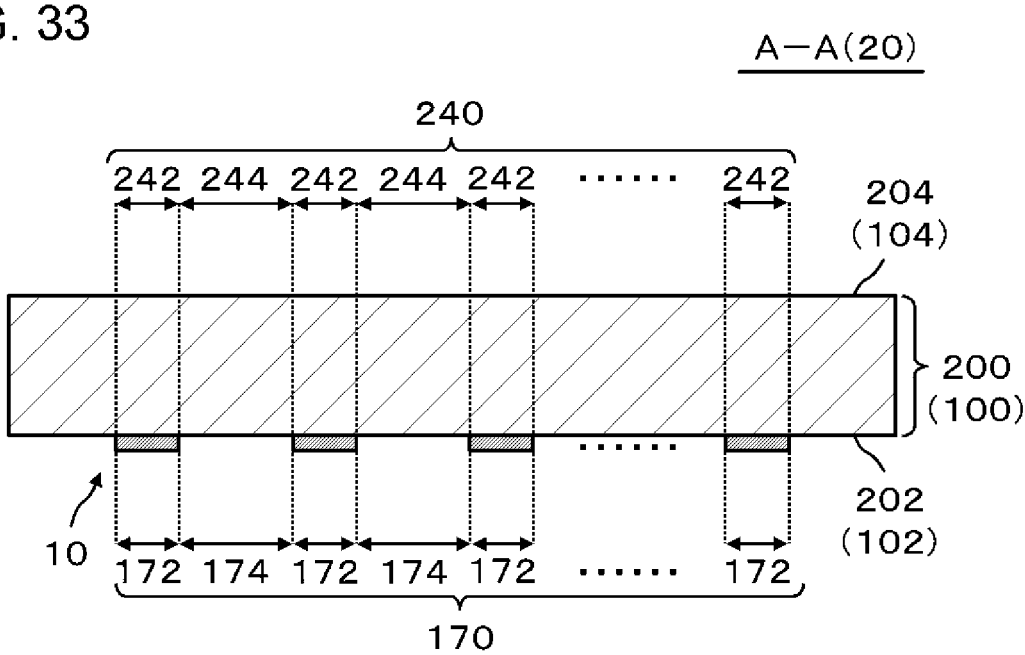
FIG. 33 is a diagram of a third modification example of FIG. 24.

FIG. 33 is a drawing showing a third modification example of FIG. 24. As shown in the drawing, the light-emitting element 170 may be formed directly on the first surface 202 of the base material 200. In other words, in the example shown in the drawing, the light-emitting device 10 does not include the substrate 100 (FIG. 24). Further in other words, in the example shown in the drawing, the base material 200 functions as the substrate 100.

Example 3

Figure 34:
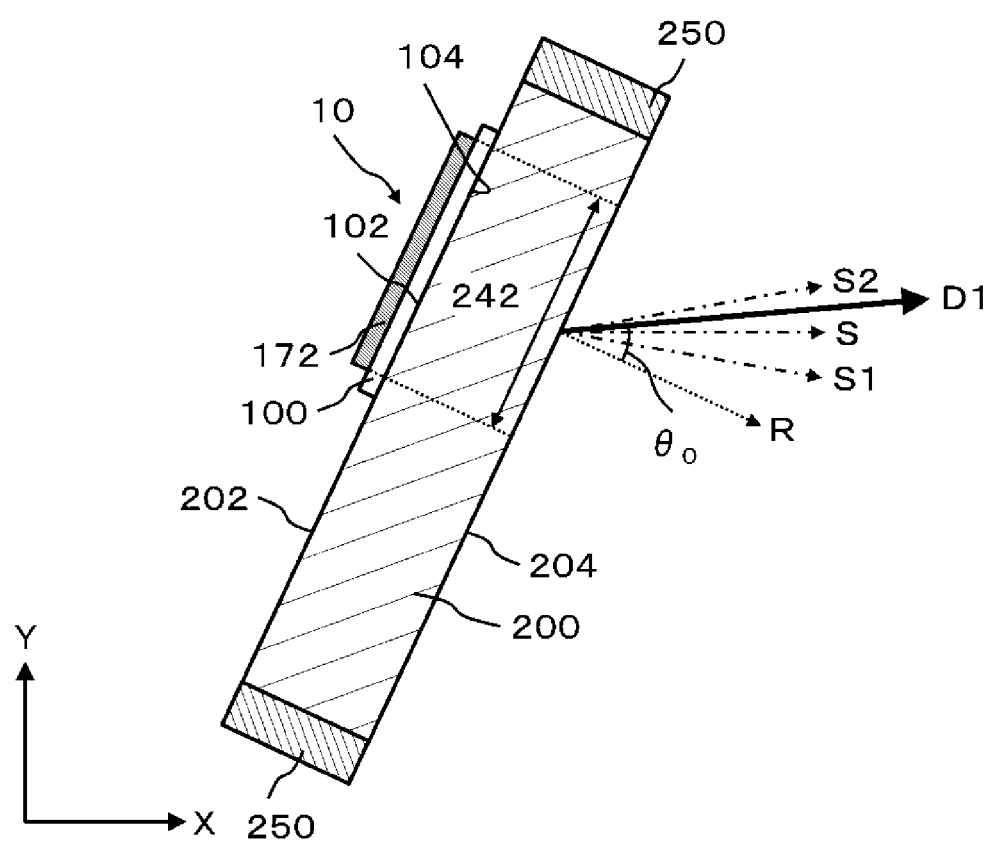
FIG. 34 is a cross-sectional view of a light-emitting system according to Example 3.

FIG. 34 is a cross-sectional view of a light-emitting system 20 according to Example 3, and corresponds to FIG. 25 of Example 2. The light-emitting system 20 according to the present example is the same as the light-emitting system 20 according to Example 2 except the following point.

In the example shown in the drawing, a standard direction S is a horizontal direction (a direction along X direction in the drawing). A first direction D1 is oriented obliquely upward from the standard direction S (the horizontal direction). A first side direction S1 is oriented obliquely downward from the standard direction S (the horizontal direction). A second side direction S2 is oriented obliquely upward from the standard direction S (the horizontal direction). As shown in the drawing, a base material 200 may be supported so that a second surface 204 is oriented obliquely downward from the standard direction S. Thereby, a reference direction R is oriented obliquely downward from the standard direction S. Meanwhile, the standard direction S is not limited to the horizontal direction. For example, the standard direction S may be inclined from the horizontal direction.

A light distribution of light from a light-emitting region 242 (more specifically, a light-emitting unit 172) has a maximum value in the first direction D1. The first direction D1 is different from the standard direction S. Specifically, an angle formed between the first direction D1 and the reference direction R is greater than an angle formed between the standard direction S and the reference direction R. In other words, the first direction D1 is located farther from the reference direction R compared to the standard direction S. Thereby, due to the same reason as the reason explained using FIG. 25 and FIG. 26, in a light distribution of light from the light-emitting system 20, a luminous intensity in the standard direction S and a surrounding direction thereof is not remarkably changed.

Light from the light-emitting system 20 has a standard chromaticity in the standard direction S. In addition, the light from the light-emitting system 20 has a first chromaticity and a second chromaticity in the first side direction S1 and the second side direction S2, respectively, the first side direction S1 and the second side direction S2 being symmetric with respect to the standard direction S. An angle formed between the first side direction S1 and the reference direction R is smaller than an angle formed between the second side direction S2 and the reference direction R. In other words, the first side direction S1 is located closer to the reference direction R compared to the second side direction S2. Thereby, due to the same reason as the reason explained using FIG. 25 and FIG. 27, a difference between the first chromaticity and the standard chromaticity is smaller than a difference between the second chromaticity and the standard chromaticity.

Figure 35:
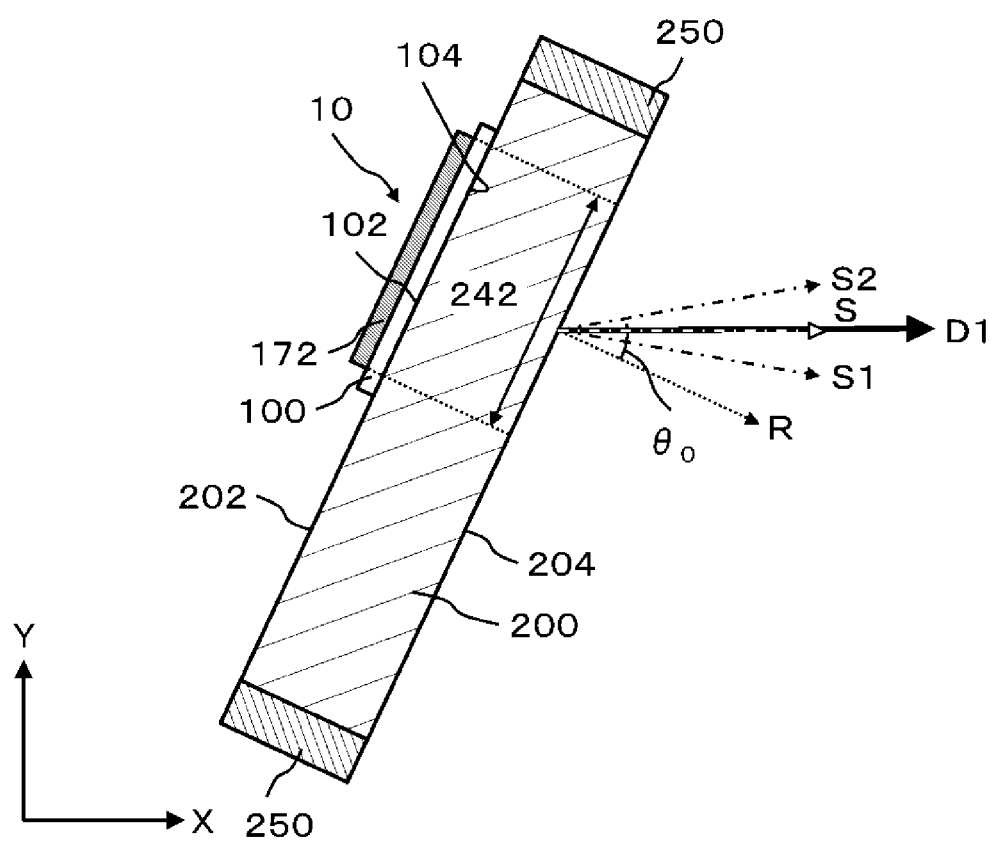
FIG. 35 is a diagram of a modification example of FIG. 34.

FIG. 35 is a drawing showing a modification example of FIG. 34. As shown in the drawing, the first direction D1 and the standard direction S may correspond to each other. In the example shown in the drawing, the light distribution of light from the light-emitting region 242 (the light-emitting unit 172) can have a maximum value in the standard direction S (for example, the horizontal direction).

Example 4

Figure 36:
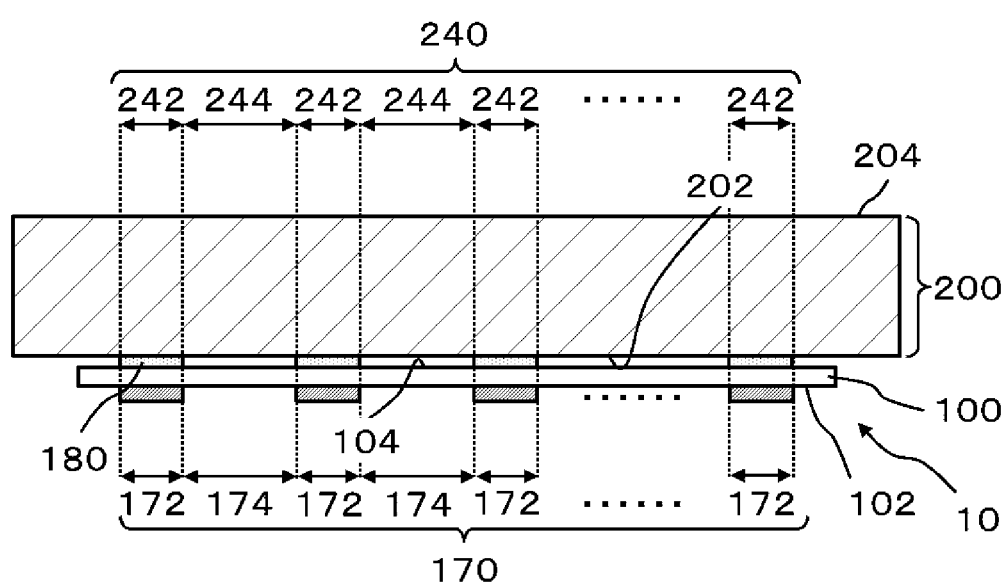
FIG. 36 is a cross-sectional view of a light-emitting system according to Example 4.
Figure 37:
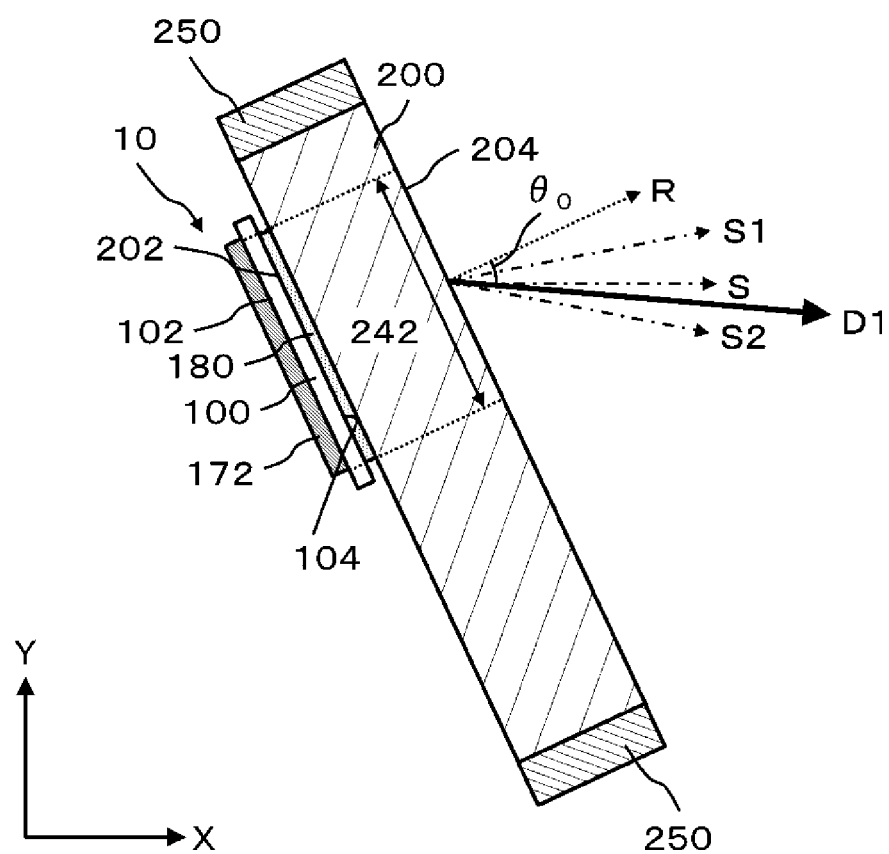
FIG. 37 is a cross-sectional view of a light-emitting system according to Example 4.

Each of FIG. 36 and FIG. 37 is a cross-sectional view of a light-emitting system 20 according to Example 4, and corresponds to FIG. 24 and FIG. 25 of Example 2, respectively. The light-emitting system 20 according to the present example is the same as the light-emitting system 20 according to Example 2 except the following point.

In the example shown in the drawing, the light-emitting system 20 includes an optical member 180. The optical member 180 is a member to adjust a traveling direction of light, and specifically, for example, is a diffraction grating, a microprism, or a polarizing film. In the example shown in the drawings, a traveling direction of light from a light-emitting unit 172 is adjusted by the optical member 180 so that a light distribution from a second surface 204 has a higher luminous intensity in a direction different from a reference direction R, specifically, in the first direction D1 compared to that in the reference direction R. Therefore, even when a base material 200 is inclined from a specific direction (for example, the standard direction S) as shown in the drawing, a light distribution of light from a light-emitting region 242 can have a high luminous intensity (for example, a maximum value) in a desired direction.

In the example shown in the drawing, a light-emitting device 10 need not be designed so that a value ΔM of the above-mentioned formula (1) satisfies equal to or greater than m−⅛ and equal to or less than m+⅛ in a case where θ≠0 degrees. In one example, the light-emitting device 10 need not include a semi-transparent reflecting layer 154 (for example, FIG. 19), in other words, need not include a microcavity structure. In another example, the light-emitting device 10 may be designed so that the value ΔM satisfies equal to or greater than m−⅛ and equal to or less than m+⅛ in a case where θ=0 degrees in the above-mentioned formula (1). In any example, by using the optical member 180, the light distribution of light from the second surface 204 has a maximum value in the direction different from the reference direction R, specifically, in the first direction D1.

In the example shown in the drawing, the optical member 180 is formed not to be overlapped with a light-transmitting unit 174 (a light-transmitting region 244). Thereby, a light transmittance of the light-emitting system 20 is inhibited from decreasing. Meanwhile, in the example shown in the drawing, the optical member 180 is located between the second surface 104 of the substrate 100 and the first surface 202 of the base material 200.

Example 5

Figure 38:
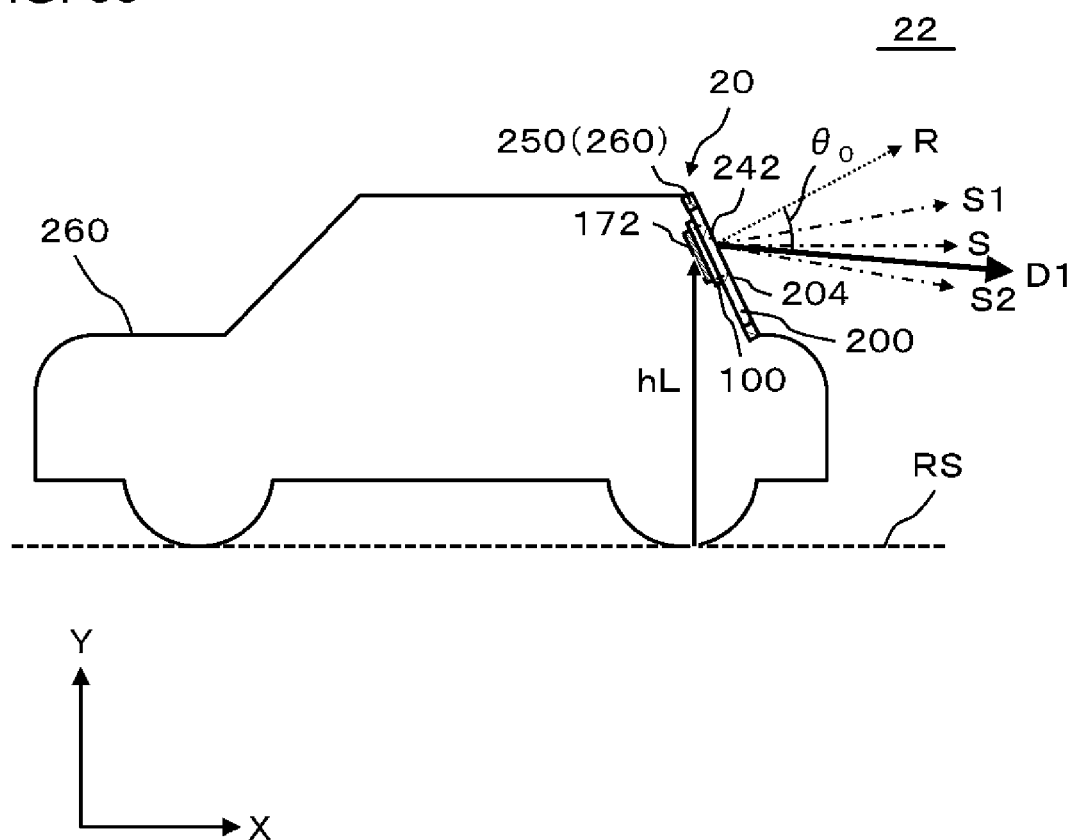
FIG. 38 is a diagram of a mobile object according to Example 5.

FIG. 38 is a drawing showing a mobile object 22 according to Example 5. In the example shown in the drawing, the mobile object 22 includes a body 260 and a light-emitting system 20. The light-emitting system 20 is held by the body 260. In the example shown in the drawing, the mobile object 22 is an automobile, and the body 260 is a vehicle body. The mobile object 22 moves on a road surface RS. Meanwhile, the mobile object 22 may be a train, a ship, or an airplane. In a case where the mobile object 22 is a train, the body 260 is a vehicle body of a train. In a case where the mobile object 22 is a ship, the body 260 is a hull. In a case where the mobile object 22 is an airplane, the body 260 is a fuselage.

In the example shown in the drawing, the standard direction S is the horizontal direction (the direction along X direction in the drawing). In addition, the standard direction S also is a direction along the road surface RS, a traveling direction of the mobile object 22, and a direction to the rear side of the mobile object 22. In a first direction D1, a light distribution of light from the light-emitting region 242 (more specifically, the light-emitting unit 172) has a higher luminous intensity in the first direction D1 compared to that in the reference direction R, and specifically, has a maximum value in the first direction D1. In the example shown in the drawing, the base material 200 is supported so that the second surface 204 is oriented obliquely upward from the standard direction S. Thereby, the reference direction R is oriented obliquely upward from the standard direction S. Meanwhile, the standard direction S is not limited to the horizontal direction. For example, the standard direction S may be inclined from the horizontal direction.

In the example shown in the drawing, the first direction D1 is different from the reference direction R. Therefore, even when the base material 200 is inclined from a specific direction (for example, the standard direction S) as shown in the drawing, the light distribution of light from the light-emitting region 242 (more specifically, the light-emitting unit 172) can have a high luminous intensity (for example, a maximum value) in a desired direction.

Further, in the example shown in the drawing, the first direction D1 is oriented in a direction different from the reference direction R, and is oriented ins a direction which is substantially the same as the standard direction S. Specifically, an angle formed between the first direction D1 and the standard direction S is, for example, equal to or greater than 0 degrees and equal to or less than 5 degrees. Therefore, even when the base material 200 is inclined from a specific direction (for example, the standard direction S) as shown in the drawing, the light distribution of light from the light-emitting region 242 (more specifically, the light-emitting unit 172) can have a high luminous intensity (for example, a maximum value) in the standard direction S (in the example shown in the drawing, the horizontal direction) and in the vicinity thereof.

The mobile object 22 includes the body 260. A portion of the body 260 functions as a frame body 250. In the example shown in the drawing, the base material 200 is supported by the frame body 250, and functions as a rear window.

In the example shown in the drawing, the light-emitting unit 172 (the light-emitting region 242) configures a portion of an "auxiliary brake lamp" (in other words, a high-mount stop-lamp (HMSL) or a break lamp) prescribed in Article 39, Paragraph 2 of the Safety Standards of Road Transport Vehicle in Japan. The light-emitting unit 172 (specifically, the center of the light-emitting unit 172) is located at a height hL which is, for example, equal to or greater than 1 m and equal to or less than 1.2 m from the road surface RS on which the mobile body travels.

The light distribution of light from the light-emitting region 242 (more specifically, the light-emitting unit 172) has a higher luminous intensity in the standard direction S compared to that in the reference direction R. Therefore, even when the base material 200 is mounted on the mobile object 22 inclined from the standard direction S, this light distribution has a high luminous intensity in the standard direction S which is a direction of traffic following the mobile object 22. Therefore, the luminous intensity of a light emission from the light-emitting region 242 (the light-emitting unit 172) is increased. In addition, the light is efficiently irradiated in a direction of the traffic that follows, and information on braking of the mobile object 22 can be efficiently communicated or displayed.

Further, in FIG. 38, the first direction D1 is oriented obliquely downward from the standard direction S (the horizontal direction). A first side direction S1 is oriented obliquely upward from the standard direction S (the horizontal direction). A second side direction S2 is oriented obliquely downward from the standard direction S (the horizontal direction). Here, the light distribution of light from the light-emitting region 242 (more specifically, the light-emitting unit 172) has a maximum value in the first direction D1. The first direction D1 is different from the standard direction S. Specifically, an angle formed between the first direction D1 and the reference direction R is greater than an angle formed between the standard direction S and the reference direction R. In other words, the first direction D1 is located farther from the reference direction R compared to the standard direction S. Thereby, due to the same reason as the reason explained using FIG. 25 and FIG. 26, in a light distribution of light from the light-emitting system 20, a luminous intensity in the standard direction S and a surrounding direction thereof is not remarkably changed. By adopting such a configuration, the light-emitting system 20 can display information on braking of the mobile object 22 to the traffic that follows without the traffic that follows being affected by the height of the viewpoint.

Light from the light-emitting system 20 has standard chromaticity in the standard direction S. In addition, the light from the light-emitting system 20 has first chromaticity and second chromaticity in the first side direction S1 and the second side direction S2, respectively, the first side direction S1 and the second side direction S2 being symmetric with respect to the standard direction S. An angle formed between the first side direction S1 and the reference direction R is smaller than an angle formed between the second side direction S2 and the reference direction R. In other words, the first side direction S1 is located closer to the reference direction R compared to the second side direction S2. Thereby, due to the same reason as the reason explained using FIG. 25 and FIG. 27, a difference between the first chromaticity and the standard chromaticity is smaller than a difference between the second chromaticity and the standard chromaticity.

Example 6

Figure 39:
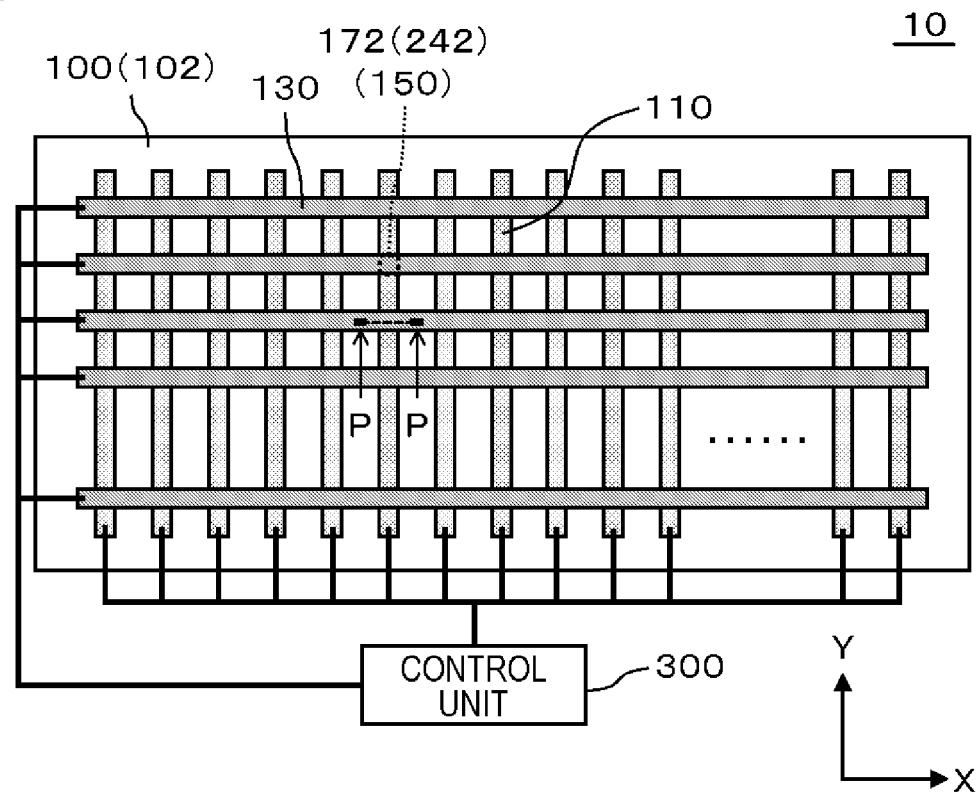
FIG. 39 is a plan view of a light-emitting device according to Example 6.

FIG. 39 is a plan view of a light-emitting device 10 according to Example 6.

The light-emitting device 10 includes a substrate 100, a plurality of first electrodes 110, and a plurality of second electrodes 130. On a first surface 102 of the substrate 100, the plurality of first electrodes 110 are aligned along an X direction and extend along a Y direction. On the first surface 102 of the substrate 100, the plurality of second electrodes 130 intersect (specifically, orthogonally intersect) the plurality of first electrodes 110, are aligned in the Y direction, and extend in the X direction.

The light-emitting device 10 has a light-emitting unit 172 (a light-emitting region 242) at an intersection of each first electrode 110 and each second electrode 130, and each of a plurality of light-emitting units 172 (a plurality of light-emitting regions 242) is disposed on each of a plurality of lattice points two-dimensionally arranged along the X direction and the Y direction.

The light-emitting device 10 includes a control unit 300. The control unit 300 controls which of the plurality of light-emitting units 172 emits light by controlling voltage of each of the plurality of first electrodes 110 and that of each of the plurality of second electrodes 130. The light-emitting device 10 can display a specific image by the control of the control unit 300.

Meanwhile, the second electrode 130 may be common among all of the light-emitting units 172. In this case, a transistor (for example, a thin film transistor (TFT)) is provided for each of the plurality of light-emitting units 172. The control unit 300 controls which light-emitting unit 172 out of the plurality of light-emitting units 172 emits light by controlling the transistors.

Emission colors of the plurality of light-emitting units 172 may be the same as, or different from each other. Particularly, in a case where the emission colors of the plurality of light-emitting units 172 are different from each other, the light-emitting device 10 can function as a display which can display a color image.

A cross-section taken along line P-P of FIG. 39 is the same as the cross section shown in FIG. 1, and the light-emitting device 10 includes a resonator 150.

A light distribution of light from at least one light-emitting unit 172 out of the plurality of light-emitting units 172 has a higher luminous intensity in a first direction D1 (for example, FIG. 2) compared to a reference direction R (for example, FIG. 2), the first direction D1 being different from the reference direction R (for example, FIG. 2), and particularly, a light distribution of light from two or more light-emitting units 172 out of the plurality of light-emitting units 172 may have a higher luminous intensity in the first direction D1 (for example, FIG. 2) compared to the reference direction R (for example, FIG. 2), the first direction D1 being different from the reference direction R (for example, FIG. 2).

In one example, first directions D1 (for example, FIG. 2) with respect to the plurality of light-emitting units 172 may be the same as each other. Particularly, in a case where the emission colors of the plurality of light-emitting units 172 are different from each other, the first direction D1 (for example, FIG. 2) may be the same for any emission color. In this example, light from the light-emitting device 10 (that is, the entire light from the plurality of light-emitting units 172) has a higher luminous intensity in the first direction D1 (for example, FIG. 2) compared to the reference direction R (for example, FIG. 2), the first direction being is different from the reference direction R (for example, FIG. 2).

In another example, the first directions D1 (for example, FIG. 2) with respect to the plurality of light-emitting units 172 may be different from each other. Particularly, in a case where the emission colors of the plurality of light-emitting units 172 are different from each other, the first direction D1 (for example, FIG. 2) may be different according to the emission color.

Figure 40:
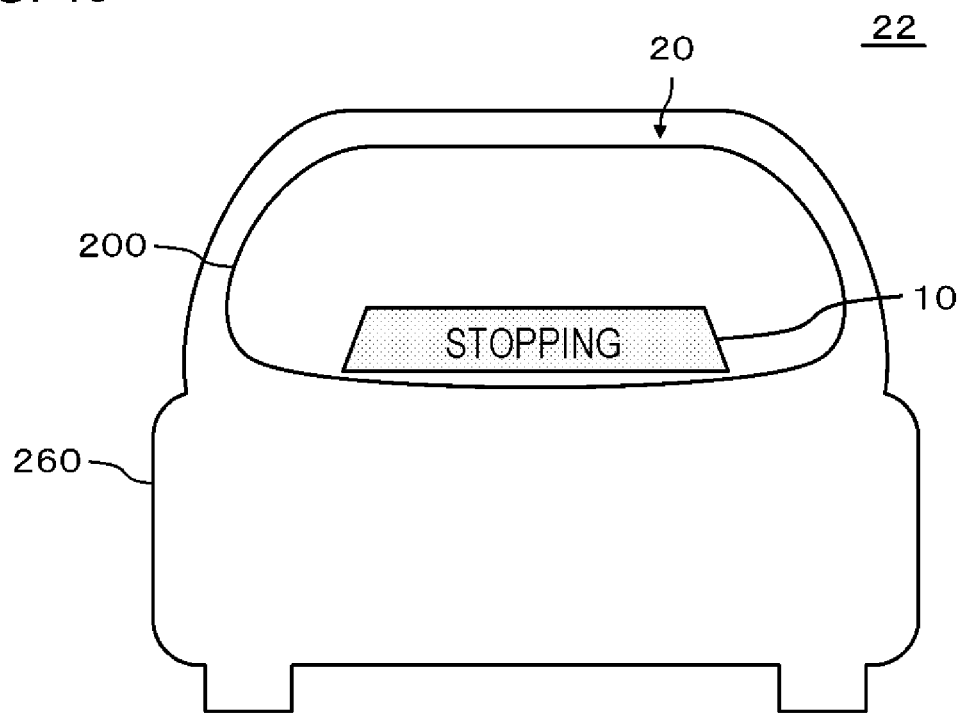
FIG. 40 is a diagram to explain a first exemplary use method of the light-emitting device shown in FIG. 39.

FIG. 40 is a drawing to explain a first exemplary use method of the light-emitting device 10 shown in FIG. 39.

The light-emitting device 10 is used in a light-emitting system 20 of a mobile object 22, and particularly, is installed on a base material 200 (a rear window) of a vehicle body 260.

The light-emitting device 10 can display various images (for example, characters) by control of the control unit 300 (FIG. 39). Particularly in the example shown in FIG. 40, the light-emitting device 10 displays characters (an image) of the word "stopping". These characters (the image) may be displayed, for example, at a timing when a brake of the mobile object 22 is applied.

In the example shown in FIG. 40, as is the case with the example shown in FIG. 38, even when the light-emitting device 10 is installed on the base material 200 so that the reference direction R is inclined from the standard direction S (in other words, even when the thickness direction of the base material 200 is inclined from the standard direction S), the light distribution of the light-emitting device 10 (that is, a light distribution of the light emission for "stopping") has a higher luminous intensity in the first direction D1 compared to the reference direction R. Therefore, a high luminous intensity can be obtained in a direction of the traffic following the mobile object 22 (that is, the standard direction S). Particularly, the emission colors of the plurality of light-emitting units 172 (FIG. 39) may be different from each other. In this case, the light-emitting device 10 can display a color image with a high luminous intensity toward the direction of the traffic following the mobile object 22.

Figure 41:
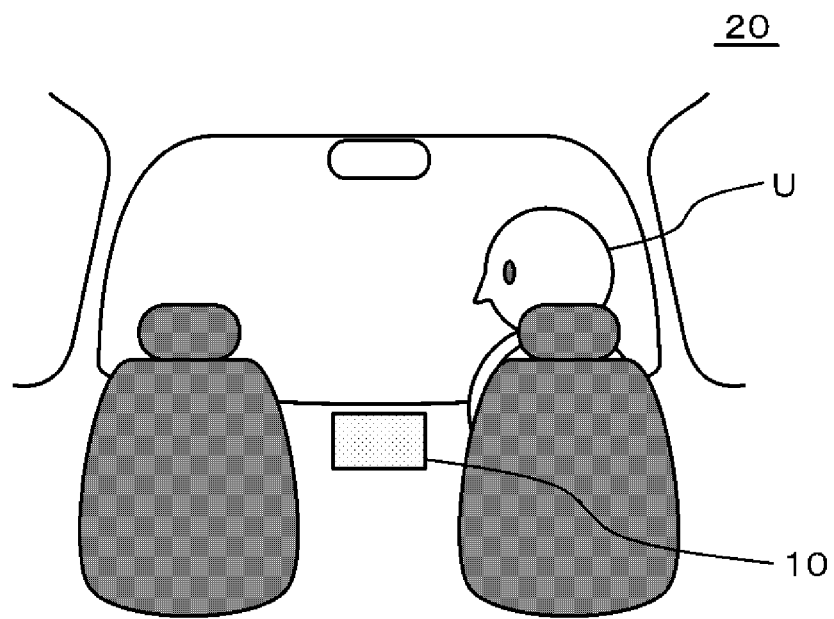
FIG. 41 is a diagram to explain a second exemplary use method of the light-emitting device shown in FIG. 39.
Figure 42:
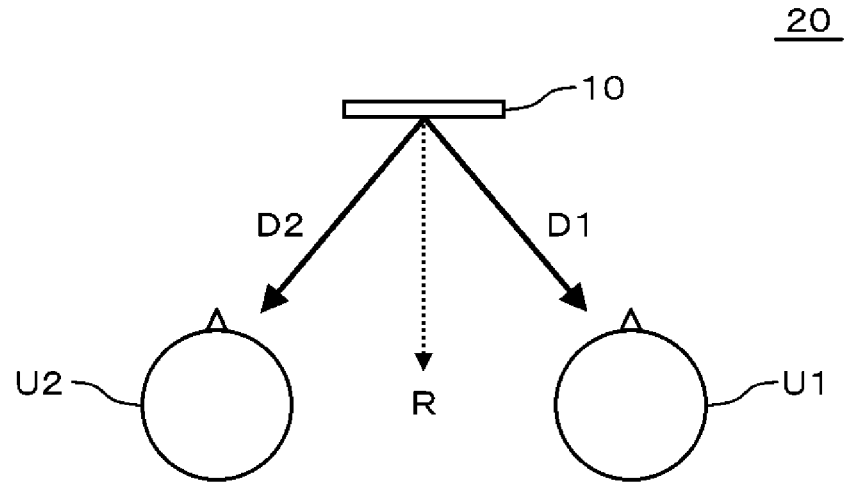
FIG. 42 is a top view of a light-emitting system shown in FIG. 41.

FIG. 41 is a drawing to explain a second exemplary use method of the light-emitting device 10 shown in FIG. 39. FIG. 42 is a top view of the light-emitting system 20 shown in FIG. 41.

In the example shown in FIG. 41, the light-emitting device 10 functions as a display of a car navigation system. That is, the emission colors of the plurality of light-emitting units 172 (FIG. 39) are different from each other. In the example shown in FIG. 41, a user U is to the right of the light-emitting device 10 and driving an automobile.

In the example shown in FIG. 42, a user U1 is to the right (that is, the driver seat of the automobile) of the light-emitting device 10, and a user U2 is to the left (that is, the passenger seat of the automobile) of the light-emitting device 10.

The light distribution of light of the light-emitting device 10 has a higher luminous intensity in the first direction D1 compared to the reference direction R, the first direction D1 being different from the reference direction R, and the first direction D1 is oriented toward the user U1 from the light-emitting device 10. The first direction D1 (for example, FIG. 2) is the same for any emission color. Therefore, the light-emitting device 10 can display an image with a high luminous intensity toward the user U1.

The light distribution of light of the light-emitting device 10 has a higher luminous intensity in a second direction D2 compared to the reference direction R, the second direction D2 being different from the reference direction R, and the second direction D2 is oriented toward the user U2 from the light-emitting device 10. The second direction D2 (for example, FIG. 2) is the same for any emission color. Therefore, the light-emitting device 10 can display an image with a high luminous intensity toward the user U2.

Particularly, the first direction D1 and the second direction D2 are symmetric with respect to the reference direction R. Therefore, by locating the light-emitting device 10 substantially in the half way between the user U1 and the user U2, light with a high luminous intensity may be sent to both of the user U1 and the user U2 from the light-emitting device 10.

As described above, although the embodiment and examples of the present invention have been set forth with reference to the accompanying drawings, they are merely illustrative of the present invention, and various configurations other than those stated above can be adopted.

This application claims priority from Japanese Patent Application No. 2016-137992, filed Jul. 12, 2016, the disclosure of which is incorporated by reference in its entirety.

The invention claimed is:

1. A light-emitting device comprising:
a substrate, wherein the substrate is a single material; and
a light emitting unit, the light emitting unit comprising:
a reflecting layer,
a semi-transparent reflecting layer, and
an organic layer between the reflecting layer and the semi-transparent reflecting layer, the organic layer comprising a light-emitting layer,
wherein the semi-transparent reflecting layer, the organic layer, and the reflecting layer are arranged in this order from the substrate,
wherein the semi-transparent reflecting layer is in contact with the substrate, and
wherein a light distribution of light from the light-emitting unit has a higher luminous intensity in a first direction compared to a reference direction, the reference direction being along a thickness direction of the light-emitting layer from the organic layer to the semi-transparent reflecting layer, and the first direction being different from the reference direction.

2. The light-emitting device according to claim 1, further comprising k layers from a first layer to a k-th layer (k is an integer that is equal to or greater than 2) between the semi-transparent reflecting layer and the reflecting layer,
wherein a value ΔM defined by Formula (1) below is equal to or greater than in m−⅛ and equal to or less than m+⅛ (m is an integer that is equal to or greater than 1):

[Formula 1]

$$\Delta M = \frac{2}{\lambda}\sum_{i=1}^{k} d_i\sqrt{n_i^2 - n_0^2\sin^2\theta_0} + \frac{1}{2\pi}(\phi_S + \phi_R) \quad (1)$$

λ: peak wavelength of light from the light-emitting unit
$d_i$: thickness of i-th layer (1≤i≤k)
$n_i$: refractive index of i-th layer (1≤i≤k)
$n_0$: refractive index of medium propagated by light from the light-emitting layer
$\theta_0$: angle between the reference direction and a direction at which the light distribution has a maximum value
φS: phase shift amount of the semi-transparent reflecting layer
φR: phase shift amount of the reflecting layer.

3. The light-emitting device according to claim 1,
wherein the first direction inclines by an angle equal to or greater than 5 degrees and equal to or less than 60 degrees from the reference direction.

4. The light-emitting device according to claim 1,
wherein the light distribution has a maximum value in the first direction.

5. The light-emitting device according to claim 1,
wherein the light distribution has a higher luminous intensity compared to the reference direction in a second direction on an opposite side of the first direction with respect to the reference direction.

6. The light-emitting device according to claim 1, further comprising a plurality of the light-emitting units and a plurality of light-transmitting units,
wherein the plurality of light-emitting units comprise a first light-emitting unit and a second light-emitting unit that is adjacent to the first light-emitting unit, and
wherein the plurality of light-transmitting units comprise a first light-transmitting unit between the first light-emitting unit and the second light-emitting unit.

7. A light-emitting device comprising:
a substrate, wherein the substrate is a single material; and
a plurality of light-emitting units, each light-emitting unit comprising:
a reflecting layer,
a semi-transparent reflecting layer, and
an organic layer between the reflecting layer and the semi-transparent layer, the organic layer comprising a light-emitting layer,
wherein the semi-transparent reflecting layer, the organic layer, and the reflecting layer are arranged in this order from the substrate,
wherein the semi-transparent reflecting layer is in contact with the substrate,
wherein a light distribution of light from at least one light-emitting unit out of the plurality of light-emitting units has a higher luminous intensity in a first direction compared to a reference direction, the reference direction being along a thickness direction of the light-emitting layer from the organic layer to the semi-transparent reflecting layer, and the first direction being different from the reference direction, and
wherein the plurality of light-emitting units emit light of different emission colors.

8. The light-emitting device according to claim 7,
wherein a light distribution of light from two or more light-emitting units out of the plurality of light-emitting units has the higher luminous intensity in the first direction compared to the reference direction.

9. The light-emitting device according to claim 1, wherein the substrate is one of a glass substrate and a resin substrate.

10. A light-emitting device comprising:
a substrate; and
a light emitting unit, the light emitting unit comprising:
a reflecting layer,
a semi-transparent reflecting layer, and
an organic layer between the reflecting layer and the semi-transparent reflecting layer, the organic layer comprising a light-emitting layer,
wherein the semi-transparent reflecting layer, the organic layer, and the reflecting layer are arranged in this order from the substrate,
wherein the semi-transparent reflecting layer is in contact with the substrate, and
wherein a light distribution of light from the light-emitting unit has a higher luminous intensity in a first direction compared to a reference direction, the reference direction being along a thickness direction of the light-emitting layer from the organic layer to the semi-transparent reflecting layer, and the first direction being different from the reference direction.

11. A light-emitting device comprising:
a substrate comprising a plane surface; and
a light emitting unit, the light emitting unit comprising:
a reflecting layer,
a semi-transparent reflecting layer, and
an organic layer between the reflecting layer and the semi-transparent reflecting layer, the organic layer comprising a light-emitting layer,
wherein the semi-transparent reflecting layer, the organic layer, and the reflecting layer are arranged in this order from the plane surface of the substrate,
wherein the plane surface of the substrate comprises a first region overlapping the light emitting unit and a second region extending from the first region and located outside the light emitting unit,
wherein the semi-transparent reflecting layer is in contact with the plane surface of the substrate, and
wherein a light distribution of light from the light-emitting unit has a higher luminous intensity in a first direction compared to a reference direction, the reference direction being along a thickness direction of the light-emitting layer from the organic layer to the semi-transparent reflecting layer, and the first direction being different from the reference direction.

12. The light-emitting device according to claim 11, further comprising k layers from a first layer to a k-th layer (k is an integer that is equal to or greater than 2) between the semi-transparent reflecting layer and the reflecting layer,
wherein a value $\Delta M$ defined by Formula (1) below is equal to or greater than in $m - \frac{1}{8}$ and equal to or less than $m + \frac{1}{8}$ (m is an integer that is equal to or greater than 1):

[Formula 1]

$$\Delta M = \frac{2}{\lambda} \sum_{i=1}^{k} d_i \sqrt{n_i^2 - n_0^2 \sin^2 \theta_0} + \frac{1}{2\pi}(\phi_S + \phi_R) \quad (1)$$

$\lambda$: peak wavelength of light from the light-emitting unit
$d_i$: thickness of i-th layer ($1 \leq i \leq k$)
$n_i$: refractive index of i-th layer ($1 \leq i \leq k$)
$n_0$: refractive index of medium propagated by light from the light-emitting layer
$\theta_0$: angle between the reference direction and a direction at which the light distribution has a maximum value
$\varphi S$: phase shift amount of the semi-transparent reflecting layer
$\varphi R$: phase shift amount of the reflecting layer.

13. The light-emitting device according to claim 11,
wherein the first direction inclines by an angle equal to or greater than 5 degrees and equal to or less than 60 degrees from the reference direction.

14. The light-emitting device according to claim 11,
wherein the light distribution has a maximum value in the first direction.

15. The light-emitting device according to claim 11,
wherein the light distribution has a higher luminous intensity compared to the reference direction in a second direction on an opposite side of the first direction with respect to the reference direction.

16. The light-emitting device according to claim 11, further comprising a plurality of the light-emitting units and a plurality of light-transmitting units, wherein the plurality of light-emitting units comprise a first light-emitting unit and a second light-emitting unit that is adjacent to the first light-emitting unit, and wherein the plurality of light-transmitting units comprise a first light-transmitting unit between the first light-emitting unit and the second light-emitting unit.

* * * * *